(12) United States Patent
Fukahori et al.

(10) Patent No.: US 11,469,593 B2
(45) Date of Patent: Oct. 11, 2022

(54) THIN-FILM ESD PROTECTION DEVICE WITH COMPACT SIZE

(71) Applicant: Murata Manufacturing Co., Ltd., Nagaokakyo (JP)

(72) Inventors: Souko Fukahori, Nagaokakyo (JP); Nobuo Sakai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 668 days.

(21) Appl. No.: 16/351,694

(22) Filed: Mar. 13, 2019

(65) Prior Publication Data

US 2019/0214815 A1 Jul. 11, 2019

Related U.S. Application Data

(63) Continuation of application No. PCT/JP2018/003960, filed on Feb. 6, 2018.

(30) Foreign Application Priority Data

Mar. 22, 2017 (JP) .............................. JP2017-055235

(51) Int. Cl.
*H02H 9/04* (2006.01)
*H01L 49/02* (2006.01)
*H01L 27/02* (2006.01)

(52) U.S. Cl.
CPC ......... *H02H 9/046* (2013.01); *H01L 27/0248* (2013.01); *H01L 28/10* (2013.01); *H01L 28/40* (2013.01)

(58) Field of Classification Search
CPC .. H01G 2/20; H01G 2/22; H01G 2/14; H01G 5/013; H01G 5/011; H01G 4/224;
(Continued)

(56) References Cited

U.S. PATENT DOCUMENTS 6,147,853 A 11/2000 Berthiot
6,534,831 B2 3/2003 Kato
(Continued)

FOREIGN PATENT DOCUMENTS

JP H04363006 A 12/1992
JP H0729732 A 1/1995
(Continued)

OTHER PUBLICATIONS

International Search Report issued for PCT/JP2018/003960, dated Mar. 6, 2018.
(Continued)

*Primary Examiner* — Thienvu V Tran
*Assistant Examiner* — Nusrat Quddus
(74) *Attorney, Agent, or Firm* — ArentFox Schiff LLP

(57) ABSTRACT

A thin-film ESD protection device includes a semiconductor substrate including a low-resistivity portion at least adjacent to a first principal surface thereof; an insulating layer formed on the first principal surface; first and second input/output electrodes, and a ground electrode formed on a surface of the insulating layer. Moreover, a diode element and a capacitor element are formed adjacent to the first principal surface. The diode element is connected at a first end thereof to the first input/output electrode and connected at a second end thereof to the ground electrode. The capacitor element is connected at a third end thereof to the second input/output electrode and connected at a fourth end thereof to the ground electrode. The second end of the diode element and the fourth end of the capacitor element are connected by the low-resistivity portion of the semiconductor substrate to the ground electrode.

18 Claims, 16 Drawing Sheets

(58) Field of Classification Search
CPC .......... H01G 4/01; H01G 4/005; H01G 4/002;
H01G 4/228; H01G 4/252; H01G 4/248;
H01G 4/06; H01G 4/008; H01G 4/0085;
H01L 23/60; H01L 27/0248; H01L 28/10;
H01L 28/40; H02H 3/22; H02H 3/023;
H02H 3/025; H02H 3/026; H02H 3/028;
H02H 9/00; H02H 9/046; H05K 1/0259;
H01H 47/22; H03H 2001/0092
USPC ............. 361/54–58, 90–91.6, 197, 153–156,
361/141–149, 268, 270, 272, 277, 278,
361/301.3, 306.1, 308.3, 330
See application file for complete search history.

(56) References Cited

U.S. PATENT DOCUMENTS

| | | | |
|---|---|---|---|
| 7,786,837 B2* | 8/2010 | Hebert | H01F 27/292 |
| | | | 336/200 |
| 7,838,965 B2 | 11/2010 | Klee et al. | |
| 8,912,660 B2* | 12/2014 | Kato | H01L 27/0296 |
| | | | 257/774 |
| 9,397,251 B2* | 7/2016 | Eickelmann | H01L 27/142 |
| 9,560,757 B2 | 1/2017 | Murayama et al. | |
| 9,704,847 B2 | 7/2017 | Nakaiso et al. | |
| 9,991,251 B2 | 6/2018 | Nakaiso et al. | |
| 10,790,792 B2* | 9/2020 | Nakaiso | H05K 1/165 |
| 10,855,074 B2* | 12/2020 | Nakaiso | H03H 7/0107 |
| 2001/0033001 A1 | 10/2001 | Kato | |
| 2008/0258257 A1* | 10/2008 | Klee | H01L 27/0805 |
| | | | 257/532 |
| 2013/0099353 A1* | 4/2013 | Kato | H01L 23/60 |
| | | | 257/531 |
| 2015/0257266 A1 | 9/2015 | Murayama et al. | |
| 2016/0233201 A1* | 8/2016 | Sakai | H01L 33/62 |
| 2016/0351556 A1* | 12/2016 | Nakaiso | B81B 7/0022 |
| 2017/0256497 A1* | 9/2017 | Mano | H05K 1/183 |
| 2017/0271318 A1 | 9/2017 | Nakaiso et al. | |
| 2019/0123040 A1* | 4/2019 | Fukahori | H01L 23/528 |
| 2019/0214194 A1* | 7/2019 | Fukahori | H01G 4/2325 |

FOREIGN PATENT DOCUMENTS

| | | |
|---|---|---|
| JP | H10284691 A | 10/1998 |
| JP | H11168175 A | 6/1999 |
| JP | 2001308330 A | 11/2001 |
| JP | 2005228807 A | 8/2005 |
| JP | 2008054055 A | 3/2008 |
| JP | 2008532308 A | 8/2008 |
| JP | 2013065771 A | 4/2013 |
| WO | 2014097836 A1 | 6/2014 |
| WO | 2015151786 A1 | 10/2015 |

OTHER PUBLICATIONS

Written Opinion of the International Searching Authority issued for PCT/JP2018/003960, dated Mar. 6, 2018.

* cited by examiner

THIN-FILM ESD PROTECTION DEVICE WITH COMPACT SIZE

CROSS REFERENCE TO RELATED APPLICATIONS

The present application is a continuation of PCT/JP2018/003960 filed Feb. 6, 2018, which claims priority to Japanese Patent Application No. 2017-055235, Mar. 22, 2017, the entire contents of each of which are incorporated herein by reference.

TECHNICAL FIELD

The present disclosure relates to a thin-film ESD protection device having an ESD protection function, and more particularly relates to a thin-film ESD protection device that includes a diode and a capacitor.

BACKGROUND

To prevent damage to, and malfunction of, electronic devices caused by electro-static discharge (ESD), various types of ESD protection circuits are currently used. ESD protection circuits are circuits that protect a subsequent electronic circuit from ESD by transferring ESD to the ground or the like. For example, an ESD protection circuit is disposed between a signal line and the ground (or earth).

Patent Document 1 (identified below) discloses an electronic device in which, as a protective measure against ESD, a filter circuit having an ESD protection function is provided in the vicinity of an antenna terminal, for example.

Patent Document 1: Japanese Unexamined Patent Application Publication No. 2008-54055.

However, mounting a plurality of discrete components on a mount board to form a circuit having an ESD protection function, such as that described in Patent Document 1, requires a large mounting area. Moreover, since wiring for connecting the discrete components is formed on the mount board, the resulting increase in wiring length causes an increase in parasitic inductance and this may make it difficult to achieve required characteristics.

SUMMARY OF THE INVENTION

Therefore, it is an object of the present disclosure to provide a thin-film ESD protection device that is configured to reduce variation in electrical characteristics, requires a smaller mounting area, and thus is compact in size.

Accordingly, a thin-film ESD protection device is provided according to an exemplary embodiment of the present disclosure that includes a semiconductor substrate including a low-resistivity portion at least adjacent to a first principal surface thereof; an insulating layer formed on the first principal surface of the semiconductor substrate; a first input/output electrode, a second input/output electrode, and a ground electrode formed on a surface of the insulating layer; and a diode element formed adjacent to the first principal surface. Moreover, the diode element has a first end electrically connected to the first input/output electrode and a second end electrically connected to the ground electrode. A capacitor element is formed adjacent to the first principal surface and has a first end electrically connected to the second input/output electrode and a second end electrically connected to the ground electrode. Moreover, the second end of the diode element and the second end of the capacitor element are electrically connected by the low-resistivity portion to the ground electrode.

In this configuration, the diode element and the capacitor element are integrally formed. Therefore, the mounting area required to form a circuit can be made smaller than when a chip diode and a chip capacitor (which are discrete components) are mounted on a mount board or the like. With this configuration, moreover, the wiring length between elements formed in the thin-film ESD protection device can be made shorter than when the discrete components are mounted on the mount board or the like. Therefore, the conductor resistance and the parasitic inductance in the wiring between elements can be reduced, and it is possible to provide a thin-film ESD protection device which is low in ESD suppression voltage and high in responsivity.

Also, this configuration eliminates the need to add wiring that connects the second end of the diode element to the fourth end of the capacitor element. The number of person-hours for the manufacture and lower the costs can be reduced.

In an exemplary aspect, the entire semiconductor substrate is preferably the low-resistivity portion. Since this configuration eliminates the need to additionally form a low-resistivity portion in the semiconductor substrate, it is possible to reduce the number of person-hours for the manufacture and lower the costs. Additionally, this configuration enables the low-resistivity portion electrically connected to the ground electrode to function as a relatively large ground electrode and thus stabilizes the ground potential.

In an exemplary aspect, the diode element preferably includes an anode electrode and a cathode electrode; the capacitor element include a first capacitor electrode and a second capacitor electrode; and the low-resistivity portion serve as the cathode or anode electrode and as the second capacitor electrode. Since this configuration eliminates the need to form the cathode electrode and the second capacitor electrode, it is possible to reduce the number of person-hours for the manufacture and lower the costs.

In an exemplary aspect, the diode element preferably includes an anode electrode and a cathode electrode; the capacitor element include a first capacitor electrode and a second capacitor electrode; and the anode or cathode electrode of the diode element be made of the same material as the first capacitor electrode or the second capacitor electrode. This configuration enables the diode electrode and the first capacitor electrode to be simultaneously formed in the same step. It is thus possible to reduce the number of person-hours for the manufacture and lower the costs.

In an exemplary aspect, the diode element preferably includes an anode electrode and a cathode electrode; the capacitor element include a first capacitor electrode, a second capacitor electrode, and a dielectric layer; and the insulating layer be made of the same material as the dielectric layer. This configuration enables the insulating layer and the dielectric layer to be simultaneously formed in the same step. It is thus possible to reduce the number of person-hours for the manufacture and lower the costs.

In an exemplary aspect, the semiconductor substrate and the insulating layer preferably form a multilayer body. In this aspect, the multilayer body is in the shape of a rectangle having a first side and a second side opposite each other in plan view of the first principal surface, the first input/output electrode and the second input/output electrode are disposed near the first side; and the ground electrode is disposed near the second side. This configuration does not require routing of long wiring in a planar direction parallel to the first principal surface and enables each of the elements and a corresponding one of the electrodes (first input/output electrode, second input/output electrode, and ground electrode) to be connected in the shortest distance. It is thus possible to reduce the conductor resistance and the parasitic inductance in the wiring between each element and the electrode.

In an exemplary aspect, the ground electrode is interposed between the first and second input/output electrodes in plan view of the first principal surface. With this configuration, ESD applied to one of the input/output electrodes can be prevented from flowing to the other input/output electrode mainly through the low-resistivity portion. As a result, isolation can be enhanced between the first input/output electrode P1 and the second input/output electrode P2 against ESD.

In an exemplary aspect, in the plan view of the first principal surface, a distance between the first input/output electrode and the ground electrode is equal to a distance between the second input/output electrode and the ground electrode. It is noted that if the distance varies, dynamic resistance between each input/output electrode and the ground electrode also varies. The configuration described above can reduce variation in dynamic resistance between each input/output electrode and the ground electrode, and thus can eventually reduce variation in ESD suppression voltage between each input/output electrode and the ground electrode.

In an exemplary aspect, the thin-film ESD protection device can further include an inductor element formed in the insulating layer and having a first end electrically connected to the first input/output electrode and a second end electrically connected to the second input/output electrode. In this configuration, the diode element, the capacitor element, and the inductor element are integrally formed. Therefore, the mounting area required to form a circuit can be made smaller than when a chip inductor (which is a discrete component) is mounted on a mount board or the like. With this configuration, moreover, the wiring length between the inductor element and the diode element and the wiring length between the inductor element and the capacitor element can be made shorter than when the discrete components are mounted on the mount board or the like. It is thus possible to reduce the conductor resistance and the parasitic inductance in the wiring between the inductor element and the diode element and the wiring between the inductor element and the capacitor element.

In an exemplary aspect, the insulating layer is at least partly formed by a magnetic body, and the inductor element includes the magnetic body and a coil conductor is formed in the insulating layer. With this configuration, because of the high magnetic permeability of the magnetic body, an inductor element having a predetermined inductance value can be obtained even with fewer turns.

In an exemplary aspect, the magnetic body is at least partly interposed between the coil conductor and the low-resistivity portion. In this configuration, where the magnetic body is interposed between the coil conductor and the low-resistivity portion, radiation of a magnetic field from the inductor element can be prevented, by the magnetic shielding effect of the magnetic body, from reaching the low-resistivity portion. It is thus possible to enhance isolation between the low-resistivity portion and the inductor element and suppress the occurrence of eddy current in the low-resistivity portion.

According to any of the above-noted exemplary embodiments, the capacitor element and the inductor element can form a low-pass filter.

The exemplary embodiments of the present disclosure provide a thin-film ESD protection device that is configured to reduce variation in electrical characteristics, requires a smaller mounting area, and thus is compact in size.

DETAILED DESCRIPTION OF EMBODIMENTS

Figure 1A:
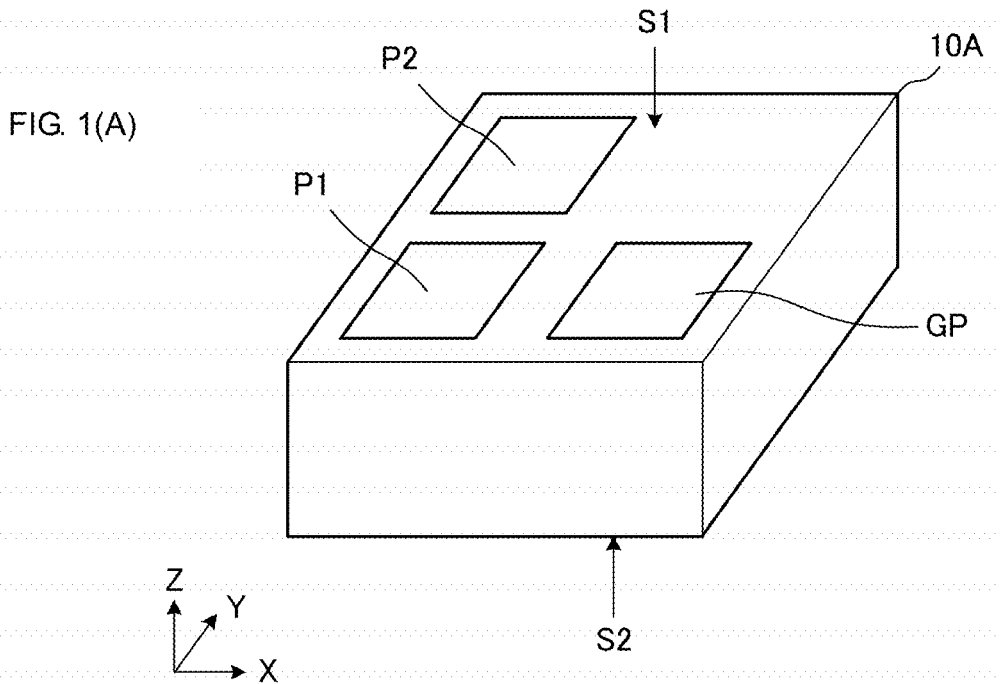
FIG. 1(A) is a perspective view of a thin-film ESD protection device 101 according to a first exemplary embodiment.

Hereinafter, a plurality of exemplary embodiments of the present disclosure will be described using some specific examples with reference to drawings. In the drawings, the same elements are denoted by the same reference numerals. For convenience and ease of explanation or understanding of essential points, different embodiments are presented in different sections. However, some of configurations presented in different embodiments may be replaced or combined. In the second and subsequent embodiments, the description of elements that are the same as those presented in the first embodiment will be omitted and different points alone will be discussed. In particular, similar advantageous effects achieved by similar configurations will not be mentioned one by one in each embodiment.

First Embodiment

Figure 1B:
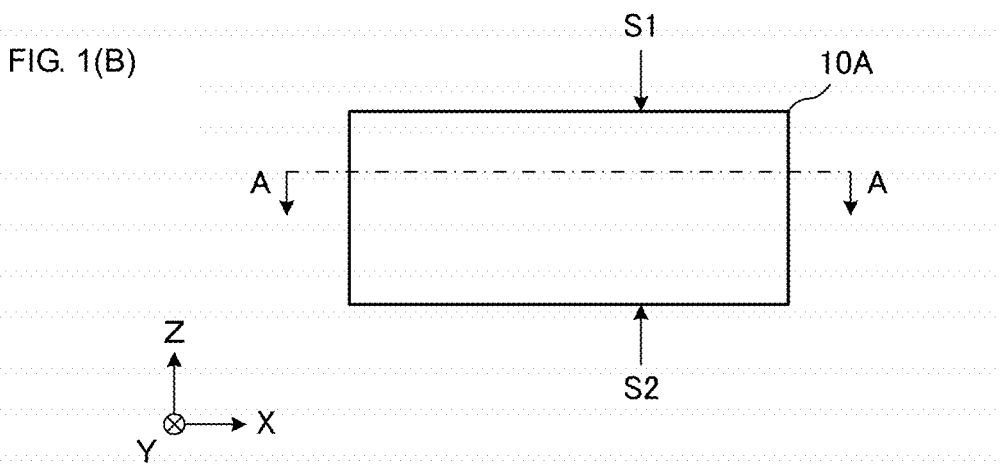
FIG. 1(B) is a front view of the thin-film ESD protection device 101.
Figure 2A:
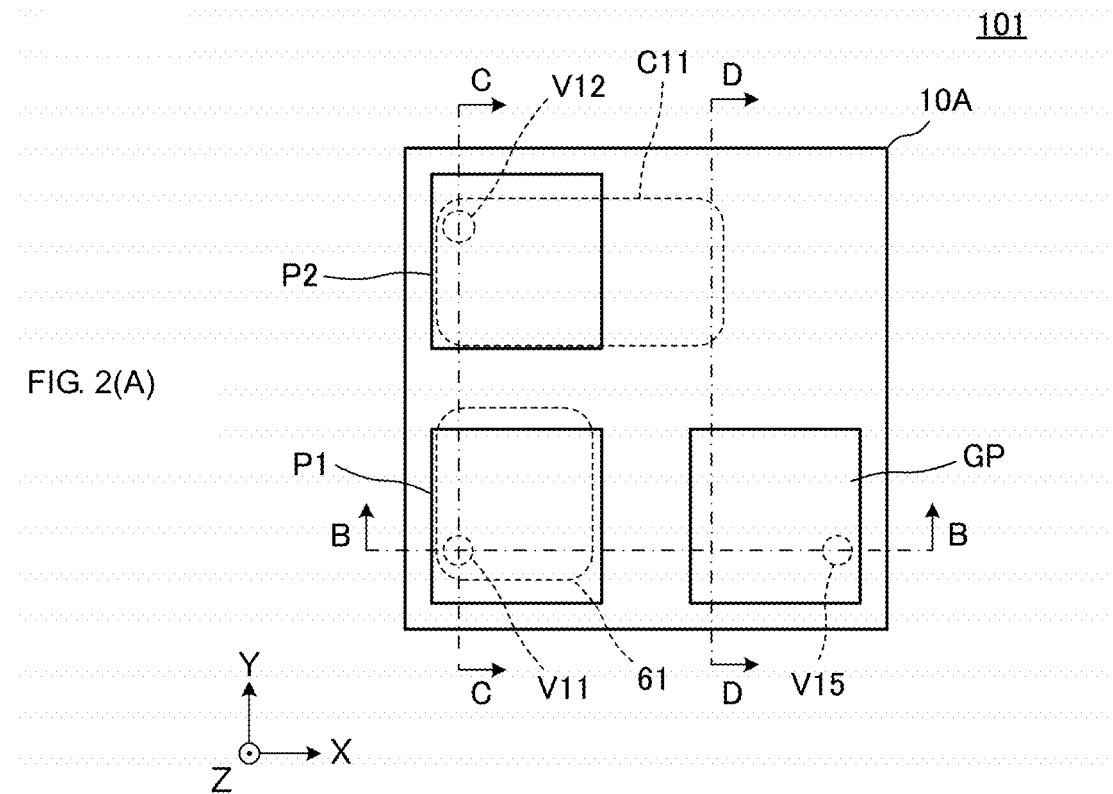
FIG. 2(A) is a bottom view of the thin-film ESD protection device 101.
Figure 2B:
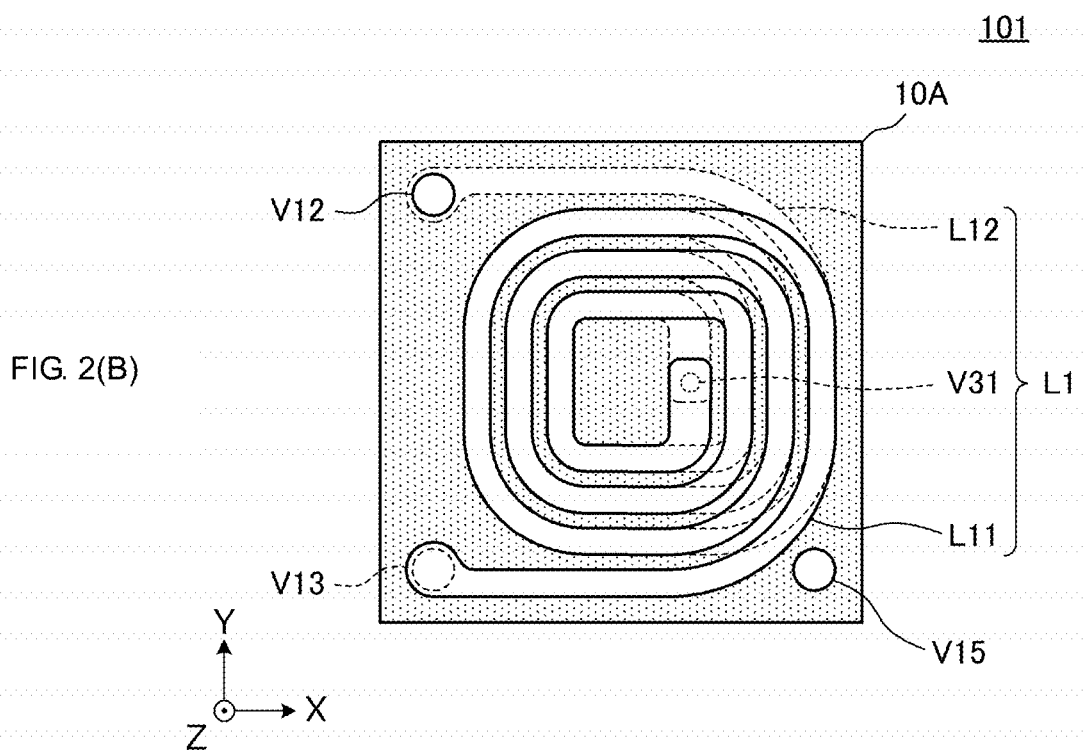
FIG. 2(B) is a cross-sectional view taken along line A-A in FIG. 1(B).
Figure 3:
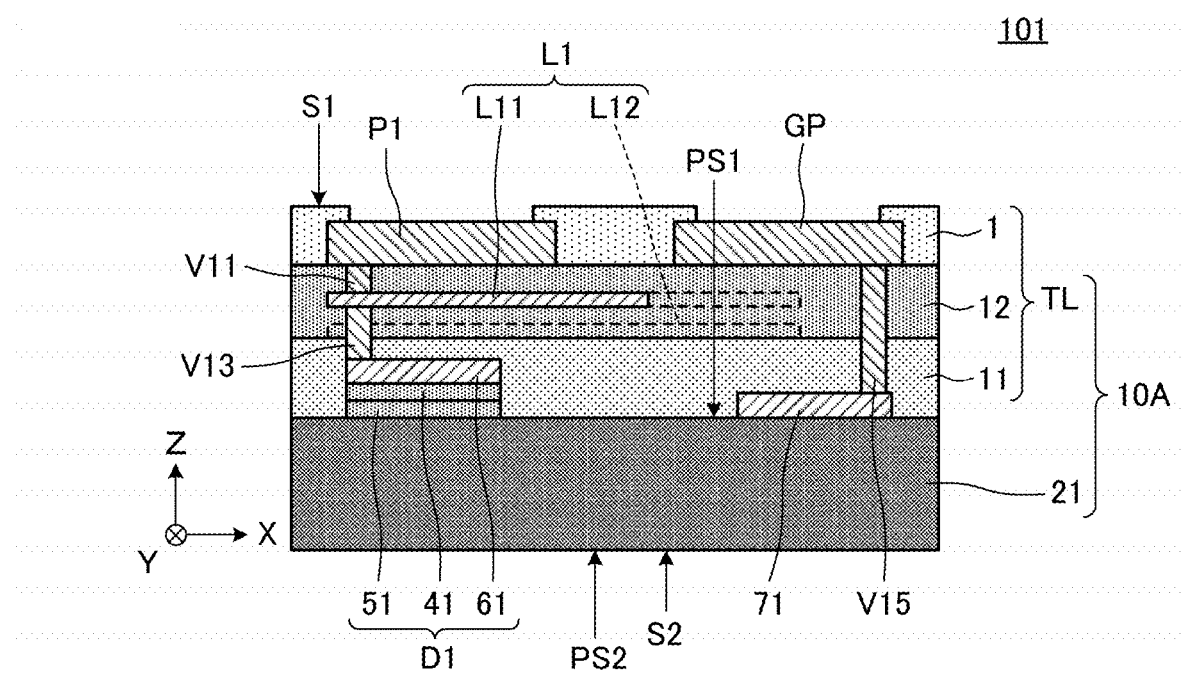
FIG. 3 is a cross-sectional view taken along line B-B in FIG. 2(A).
Figure 4A:
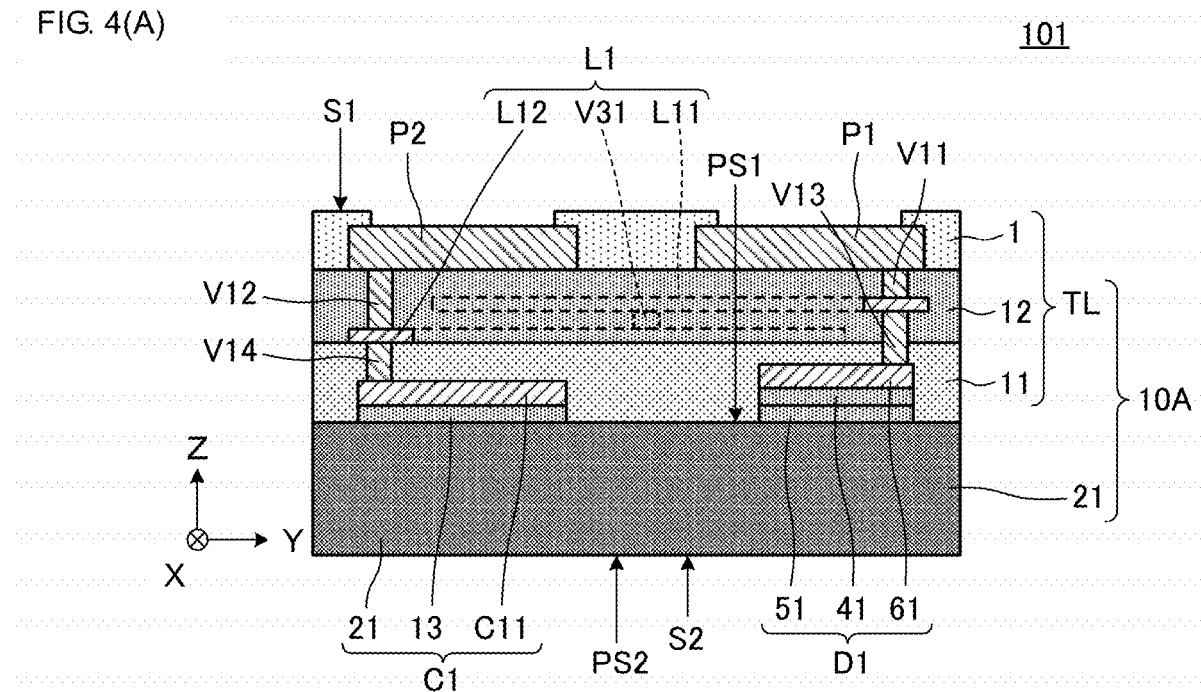
FIG. 4(A) is a cross-sectional view taken along line C-C in FIG. 2(A)
Figure 4B:
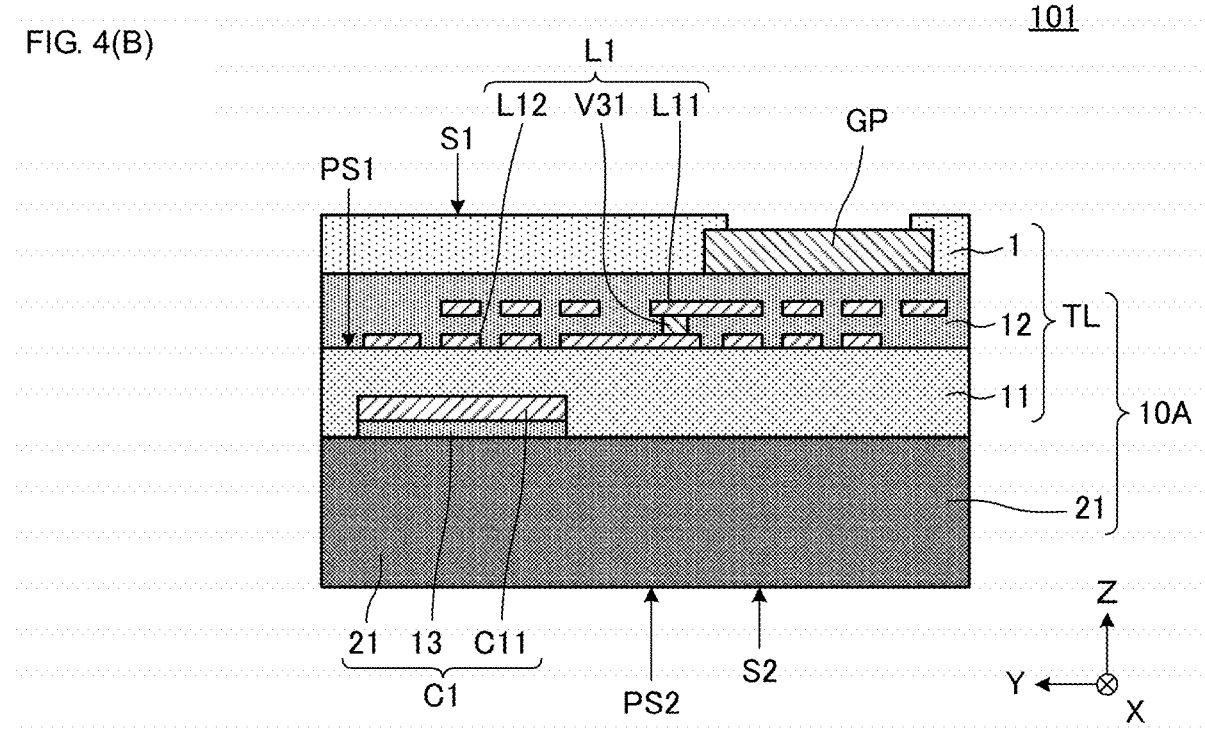
FIG. 4(B) is a cross-sectional view taken along line D-D in FIG. 2(A).

FIG. 1(A) is a perspective view of a thin-film ESD protection device 101 according to a first embodiment, and FIG. 1(B) is a front view of the thin-film ESD protection device 101. FIG. 2(A) is a bottom view of the thin-film ESD protection device 101, and FIG. 2(B) is a cross-sectional view taken along line A-A in FIG. 1(B). FIG. 3 is a cross-sectional view taken along line B-B in FIG. 2(A). FIG. 4(A) is a cross-sectional view taken along line C-C in FIG. 2(A), and FIG. 4(B) is a cross-sectional view taken along line D-D in FIG. 2(A).

The thin-film ESD protection device 101 includes a semiconductor substrate 21, an insulating layer TL, a first input/output electrode P1, a second input/output electrode P2, a ground electrode GP, a diode element D1, a capacitor element C1, and an inductor element L1.

The semiconductor substrate 21 is a rectangular-parallelepiped-shaped member having a first principal surface PS1 and a second principal surface PS2 opposite each other. The semiconductor substrate 21 includes a low-resistivity portion at least adjacent to the first principal surface PS1. The semiconductor substrate 21 is, for example, a low-resistivity Si substrate. Therefore, in the present embodiment, the entire semiconductor substrate 21 corresponds to a "low-resistivity portion" in the present disclosure.

In general, it is noted that for purposes of this disclosure, the term "low resistivity" refers to an average electrical resistivity of less than 1.0 (Ω·cm).

As illustrated, for example, in FIG. 3 and FIGS. 4(A) and 4(B), a first capacitor electrode C11, a dielectric layer 13, an n-type semiconductor layer 51, a p-type semiconductor layer 41, a diode electrode 61, a conductor 71, coil conductors L11 and L12, and interlayer connection conductors V11, V12, V13, V14, V15, and V31 are formed adjacent to the first principal surface PS1 of the semiconductor substrate 21. The first capacitor electrode C11, the diode electrode (e.g., electrode 61), and the conductor 71 are, for example, Al films according to an exemplary aspect. The dielectric layer 13 is, for example, a SiO$_2$ film. The coil conductors L11 and L12 are, for example, conductor patterns made of Cu.

The insulating layer TL is an insulating layer formed on the first principal surface PS1 of the semiconductor substrate 21 by a thin-film process. The insulating layer TL includes a first insulating layer 11, a second insulating layer 12, and a protective layer 1. As illustrated, for example, in FIG. 3, the first insulating layer 11 is formed on the first principal surface PS1 of the semiconductor substrate 21, the second insulating layer 12 is formed on the surface of the first insulating layer 11, and the protective layer 1 is formed on the surface of the second insulating layer 12. The first insulating layer 11 is, for example, a SiO$_2$ film, and the second insulating layer 12 and the protective layer 1 are made of, for example, polyimide (PI) resin, epoxy (EP) resin, or polybenzoxazole (PBO) resin.

The semiconductor substrate 21 and the insulating layer TL form a multilayer body 10A in the present embodiment. The multilayer body 10A is a substantially rectangular-parallelepiped-shaped body having a first surface S1 and a second surface S2. In plan view of the first principal surface PS1 and the second principal surface PS2 (i.e., as viewed from the Z-axis direction), the multilayer body 10A is in the shape of a rectangle having a first side and a second side (e.g., a left-hand side and a right-hand side of the multilayer body 10A in FIG. 2(A)) opposite each other.

The first input/output electrode P1, the second input/output electrode P2, and the ground electrode GP are terminals arranged in a land grid array (LGA) for mounting on a mount board or the like, and are formed like rectangular islands on a surface of the insulating layer TL (or on the first surface S1 of the multilayer body 10A). The first input/output electrode P1, the second input/output electrode P2, and the ground electrode GP are, for example, conductors formed by Ni/Au plating a conductor pattern of Cu on the surface of the second insulating layer 12.

In the present embodiment, the first input/output electrode P1 and the second input/output electrode P2 are disposed near the first side (or the left-hand side of the multilayer body 10A in FIG. 2(A)), and the ground electrode GP is disposed near the second side (or the right-hand side of the multilayer body 10A in FIG. 2(A)).

The diode element D1 is formed on the first principal surface PS1 of the semiconductor substrate 21 and includes the n-type semiconductor layer 51, the p-type semiconductor layer 41, and the diode electrode 61. Specifically, as illustrated in FIG. 3 and FIG. 4(A), the n-type semiconductor layer 51 is formed on the first principal surface PS1 of the semiconductor substrate 21, and the p-type semiconductor layer 41 is formed on the surface of the n-type semiconductor layer 51, opposite the first principal surface PS1. The n-type semiconductor layer 51 and the p-type semiconductor layer 41 are formed, for example, by chemical vapor deposition (CVD). The diode electrode 61 is formed on the surface of the p-type semiconductor layer 41. Thus, the diode element D1 is a p-n junction diode and has Zener characteristics. Therefore, the diode element D1 functions as an ESD protection element.

In the present embodiment, the diode electrode 61 corresponds to "anode electrode" according to the present disclosure, and the semiconductor substrate 21 (low-resistivity portion) corresponds to "cathode electrode" in the present disclosure.

A first end (diode electrode 61) of the diode element D1 is electrically connected by the interlayer connection conductors V11 and V13 to the first input/output electrode P1 and the coil conductor L11. A second end (i.e., part of the semiconductor substrate 21 in contact with the n-type semiconductor layer 51) of the diode element D1 is connected by the low-resistivity portion (semiconductor substrate 21), the conductor 71, and the interlayer connection conductor V15 to the ground electrode GP. That is, the low-resistivity portion (semiconductor substrate 21) is a ground potential.

According to the present disclosure, the term "electrically connected" refers to being brought into conduction through either direct or indirect connection.

The capacitor element C1 is formed adjacent to the first principal surface PS1 of the semiconductor substrate 21 and includes the first capacitor electrode C11, a second capacitor electrode, and the dielectric layer 13. As illustrated in FIG. 4(A), the dielectric layer 13 and the first capacitor electrode C11 are stacked in this order on the first principal surface PS1 of the semiconductor substrate 21.

In the present embodiment, the semiconductor substrate 21 (low-resistivity portion) corresponds to "second capacitor electrode" in the present disclosure.

A third end (i.e., a first end of the first capacitor electrode C11) of the capacitor element C1 is electrically connected by the interlayer connection conductors V12 and V14 to the second input/output electrode P2. A fourth end (i.e., part of the dielectric layer 13 in contact with the semiconductor substrate 21) of the capacitor element C1 (i.e., the second end) is electrically connected by the low-resistivity portion (semiconductor substrate 21), the conductor 71, and the interlayer connection conductor V15 to the ground electrode GP.

As illustrated, for example, in FIG. 2(A) and FIG. 4(A), the diode element D1 and the capacitor element C1 do not overlap, as viewed from the Z-axis direction. The second end (i.e., part of the semiconductor substrate 21 in contact with the n-type semiconductor layer 51) of the diode element D1 is electrically connected by the low-resistivity portion (semiconductor substrate 21) to the fourth end (i.e., part of the dielectric layer 13 in contact with the semiconductor substrate 21) of the capacitor element C1.

The inductor element L1 is formed adjacent to the first principal surface PS1 of the semiconductor substrate 21 and includes the coil conductors L11 and L12 and the interlayer connection conductor V31. The inductor element L1 is a coil having a winding axis extending in the Z-axis direction. As illustrated, for example, in FIG. 2(B) and FIGS. 4(A) and 4(B), the coil conductor L11 is a rectangular spiral conductor of about 3.5 turns formed inside the second insulating layer 12. The coil conductor L12 is a rectangular spiral conductor of about 3.5 turns formed on the surface of the first insulating layer 11. One end of the coil conductor L11 is connected by the interlayer connection conductor V31 to one end of the coil conductor L12.

As illustrated, for example, in FIG. 3 and FIG. 4(A), a fifth end of the inductor element L1 (i.e., the other end (or first end) of the coil conductor L11) is electrically connected by the interlayer connection conductor V11 to the first input/output electrode P1. A sixth end of the inductor element L1 (i.e., the other end (or second end) of the coil conductor L12) is electrically connected by the interlayer connection conductor V12 to the second input/output electrode P2.

As illustrated, for example, in FIGS. 2(A) and 2(B), FIG. 3, and FIG. 4(A), the inductor element L1 is not disposed in the same plane (XY plane) as the diode element D1 and the capacitor element C1, and is more distant from the low-resistivity portion (semiconductor substrate 21) than the diode element D1 and the capacitor element C1 are. The inductor element L1 overlaps the diode element D1 and the capacitor element C1 as viewed from the Z-axis direction.

Figure 5:
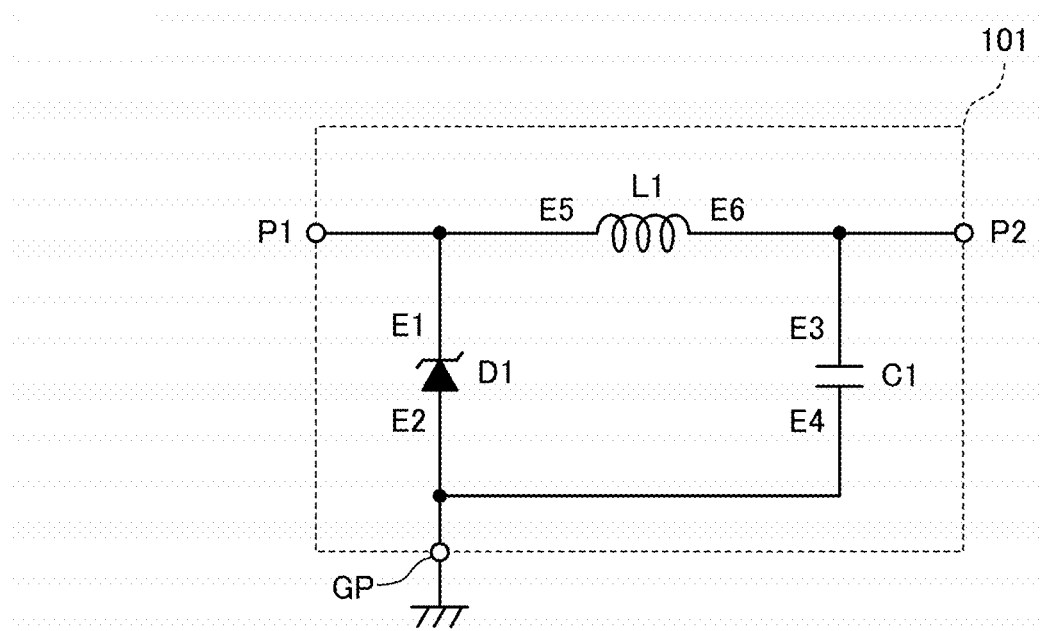
FIG. 5 is a circuit diagram of the thin-film ESD protection device 101.

FIG. 5 is a circuit diagram of the thin-film ESD protection device 101.

The thin-film ESD protection device 101 is a circuit where the inductor element L1 is connected between the first input/output electrode P1 and the second input/output electrode P2, the diode element D1 is connected between the first input/output electrode P1 and the ground electrode GP, and the capacitor element C1 is connected between the second input/output electrode P2 and the ground electrode GP.

A first end E1 of the diode element D1 is electrically connected to the first input/output electrode P1, and a second end E2 of the diode element D1 is electrically connected to the ground electrode GP. A third end E3 of the capacitor element C1 is electrically connected to the second input/output electrode P2, and a fourth end E4 of the capacitor element C1 is electrically connected to the ground electrode GP. A fifth end E5 of the inductor element L1 is electrically connected to the first input/output electrode P1 and the first end of the diode element D1, and a sixth end E6 of the inductor element L1 is electrically connected to the second input/output electrode P2 and the third end E3 of the capacitor element C1.

Thus, in the thin-film ESD protection device 101, the diode element D1, the inductor element L1, and the capacitor element C1 form a low-pass filter having an ESD protection function.

According to the present disclosure the thin-film ESD protection device 101 of the exemplary embodiments has the following advantageous technical effects.

In the thin-film ESD protection device 101, the diode element D1, the capacitor element C1, and the inductor element L1 are integrally formed. Therefore, the mounting area required to form a circuit can be made smaller than when a chip diode, a chip capacitor, and a chip inductor (which are discrete components) are mounted on a mount board or the like. With this configuration, moreover, the wiring length between elements (e.g., between the inductor element L1 and the diode element D1, between the inductor element L1 and the capacitor element C1) can be made shorter than when the discrete components are mounted on the mount board or the like. Therefore, the conductor resistance and the parasitic inductance in the wiring between elements can be reduced, and it is possible to provide a thin-film ESD protection device which is low in ESD suppression voltage and high in responsivity.

In the thin-film ESD protection device 101, the second end (i.e., part of the semiconductor substrate 21 in contact with the n-type semiconductor layer 51) of the diode element D1 is electrically connected by the low-resistivity portion (semiconductor substrate 21) to the fourth end (i.e., part of the dielectric layer 13 in contact with the semiconductor substrate 21) of the capacitor element C1. This configuration eliminates the need to add wiring that connects the second end of the diode element D1 to the fourth end of the capacitor element C1. It is thus possible to reduce the number of person-hours for the manufacture and lower the costs.

In the thin-film ESD protection device 101, the low-resistivity portion (semiconductor substrate 21) functions as the cathode electrode and the second capacitor electrode. Since this configuration eliminates the need to form the cathode electrode and the second capacitor electrode, it is possible to reduce the number of person-hours for the manufacture and lower the costs.

In the thin-film ESD protection device 101, the entire semiconductor substrate 21 is the low-resistivity portion. Since this configuration eliminates the need to additionally form a low-resistivity portion in the semiconductor substrate 21, it is possible to reduce the number of person-hours for the manufacture and lower the costs. Additionally, this configuration enables the low-resistivity portion (entire semiconductor substrate 21) electrically connected to the ground electrode GP to function as a relatively large ground electrode and thus stabilizes the ground potential. Also, when the low-resistivity portion (entire semiconductor substrate 21) functions as the second capacitor electrode, the first capacitor electrode C11 is formed on the surface of the semiconductor substrate 21 with high flatness. This makes it possible to reduce changes in capacitance and risk of short circuits caused by unevenness of the capacitor electrodes and positional displacement between the capacitor electrodes.

In the thin-film ESD protection device 101, the inductor element L1 is not disposed in the same layer (XY plane) as the diode element D1 and the capacitor element C1. Therefore, as compared to when the inductor element L1 is disposed in the same layer as the diode element D1 and the capacitor element C1, the mounting area of the thin-film ESD protection device (particularly the area on the flat surface) can be made smaller.

In the thin-film ESD protection device 101, the inductor element L1 is more distant from the low-resistivity portion (semiconductor substrate 21) than the diode element D1 and the capacitor element C1 are. Eddy current tends to flow through the low-resistivity portion (semiconductor substrate 21). Therefore, with this configuration, an inductor element with a higher Q factor and lower eddy current loss than when the inductor element L1 is closer to the low-resistivity portion (semiconductor substrate 21) than the diode element D1 and the capacitor element C1 are, can be obtained.

In the thin-film ESD protection device 101, the diode element D1 and the capacitor element C1 are both disposed adjacent to the first principal surface PS1 of the semiconductor substrate 21 and do not overlap as viewed from the Z-axis direction. If the capacitor element C1 is disposed over the diode element D1, it is difficult to ensure flatness of the capacitor electrodes forming the capacitor element C1. With the configuration describe above, it is possible to reduce changes in capacitance and risk of short circuits caused by unevenness of the capacitor electrodes.

In the present embodiment, the multilayer body 10A is in the shape of a rectangle having the first side and the second side opposite each other, as viewed from the Z-axis direction, and the first input/output electrode P1 and the second input/output electrode P2 are disposed near the first side and the ground electrode GP is disposed near the second side. This configuration does not require routing of long wiring in a planar direction (e.g., X-axis direction or Y-axis direction) parallel to the first principal surface PS1 and the second principal surface PS2 and enables each of the elements (inductor element L1, diode element D1, and capacitor element C1) and the corresponding electrode to be connected in the shortest distance. It is thus possible to reduce the conductor resistance and the parasitic inductance in the wiring between each element and the electrode.

In the thin-film ESD protection device 101, the anode electrode (diode electrode 61) of the diode element D1 and the first capacitor electrode C11 are made of the same material (Al). This configuration enables the diode electrode 61 and the first capacitor electrode C11 to be simultaneously formed in the same step. It is thus possible to reduce the number of person-hours for the manufacture and lower the costs.

In the thin-film ESD protection device 101, the dielectric layer 13 interposed between the first capacitor electrode C11 and the second capacitor electrode (semiconductor substrate 21) is made of $SiO_2$ which is paraelectric. This configuration can provide a capacitor element whose changes in capacitance, associated with changes in temperature, are smaller than when a ferroelectric material is used to form the dielectric layer 13.

Additionally, in the thin-film ESD protection device 101, the first insulating layer 11 (insulating layer TL) is made of the same material as the dielectric layer 13. This configuration enables the first insulating layer 11 (insulating layer TL) and the dielectric layer 13 to be simultaneously formed in the same step. It is thus possible to reduce the number of person-hours for the manufacture and lower the costs.

The thin-film ESD protection device 101 according to the present embodiment is manufactured, for example, by the following steps.

First, the semiconductor substrate 21 having the first principal surface PS1 is prepared. The semiconductor substrate 21 is, for example, a low-resistivity Si substrate.

Next, the diode element D1 is formed on the first principal surface PS1 of the semiconductor substrate 21. Specifically, first, after the n-type semiconductor layer 51 is formed by patterning using chemical vapor deposition (CVD) on the first principal surface PS1 (low-resistivity portion) of the semiconductor substrate 21, the p-type semiconductor layer 41 is formed by patterning using chemical vapor deposition (CVD) on the surface of the n-type semiconductor layer 51. Then, the diode electrode 61 is formed on the surface of the p-type semiconductor layer 41. The diode electrode 61 is, for example, an Al film.

The diode element D1 including the n-type semiconductor layer 51, the p-type semiconductor layer 41, and the diode electrode 61 is thus formed on the first principal surface PS1 of the semiconductor substrate 21.

Additionally, the capacitor element C1 is formed on the first principal surface PS1 of the semiconductor substrate 21 (in part of the low-resistivity portion outside the n-type semiconductor layer 51). Specifically, first, the dielectric layer 13 is formed on the first principal surface PS1 (low-resistivity portion) of the semiconductor substrate 21. Next, the first capacitor electrode C11 is formed on the surface of the dielectric layer 13. The first capacitor electrode C11 is, for example, an Al film. The dielectric layer 13 is, for example, a $SiO_2$ film.

Thus, the capacitor element C1 including the first capacitor electrode C11, the dielectric layer 13, and the low-resistivity portion (semiconductor substrate 21) is formed on the first principal surface PS1 of the semiconductor substrate 21.

The diode electrode 61 and the first capacitor electrode C11 may be simultaneously formed in the same step. This reduces the number of person-hours for the manufacture and lowers the costs.

Next, the first insulating layer 11 is formed on the first principal surface PS1 of the semiconductor substrate 21. Specifically, the first insulating layer 11 is formed by chemical vapor deposition (CVD) at least to a level which allows the n-type semiconductor layer 51, the p-type semiconductor layer 41, the diode electrode 61, the first capacitor electrode C11, and the dielectric layer 13 to be buried. The first insulating layer 11 is, for example, a $SiO_2$ film.

The first insulating layer 11 and the dielectric layer 13 may be simultaneously formed in the same step. This reduces the number of person-hours for the manufacture and lowers the costs.

Then, the interlayer connection conductor V14 is formed in the first insulating layer 11. Specifically, after a hole is formed in the first insulating layer 11 by etching or the like, the interlayer connection conductor V14 is formed by ion sputtering or the like.

Next, the inductor element L1 is formed in the second insulating layer 12. Specifically, after the coil conductor L12 is formed on the surface of the first insulating layer 11, a resin coating is applied onto the coil conductor L12. Then, after holes are formed in the resin coating by etching, the interlayer connection conductors V13 and V31 are formed, for example, by ion sputtering. After the coil conductor L11 is formed on the cured resin surface, an additional resin coating is applied onto the coil conductor L11.

The second insulating layer 12 is formed as described above. The inductor element L1 including the coil conductors L11 and L12 and the interlayer connection conductor V31 is thus formed in the second insulating layer 12

(insulating layer TL). The second insulating layer 12 is made of, for example, polyimide (PI) resin, epoxy (EP) resin, or polybenzoxazole (PBO) resin.

Next, the interlayer connection conductors V11, V12, and V15 are formed. Specifically, after holes are formed in the second insulating layer 12 by etching or the like, the interlayer connection conductors V11 and V12 are formed by ion sputtering or the like. Also, after a hole is formed in the first insulating layer 11 and the second insulating layer 12 by etching or the like, the interlayer connection conductor V15 is formed by ion sputtering or the like.

Next, the first input/output electrode P1, the second input/output electrode P2, and the ground electrode GP are formed on the surface of the second insulating layer 12. The first input/output electrode P1, the second input/output electrode P2, and the ground electrode GP are, for example, conductors formed by Ni/Au plating a conductor pattern of Cu on the surface of the second insulating layer 12.

Next, the protective layer 1 is formed on the surface of the second insulating layer 12. The protective layer 1 has cavities formed at positions corresponding to the first input/output electrode P1, the second input/output electrode P2, and the ground electrode GP. Therefore, even when the protective layer 1 is formed on the surface of the second insulating layer 12, the first input/output electrode P1, the second input/output electrode P2, and the ground electrode GP are exposed on the surface of the protective layer 1. The protective layer 1 is made of, for example, polyimide (PI) resin, epoxy (EP) resin, or polybenzoxazole (PBO) resin.

Last, the wafer is cut with a dicing machine into individual thin-film ESD protection devices 101.

Second Embodiment

A second embodiment shows an example in which the insulating layer includes a magnetic body.

Figure 6A:
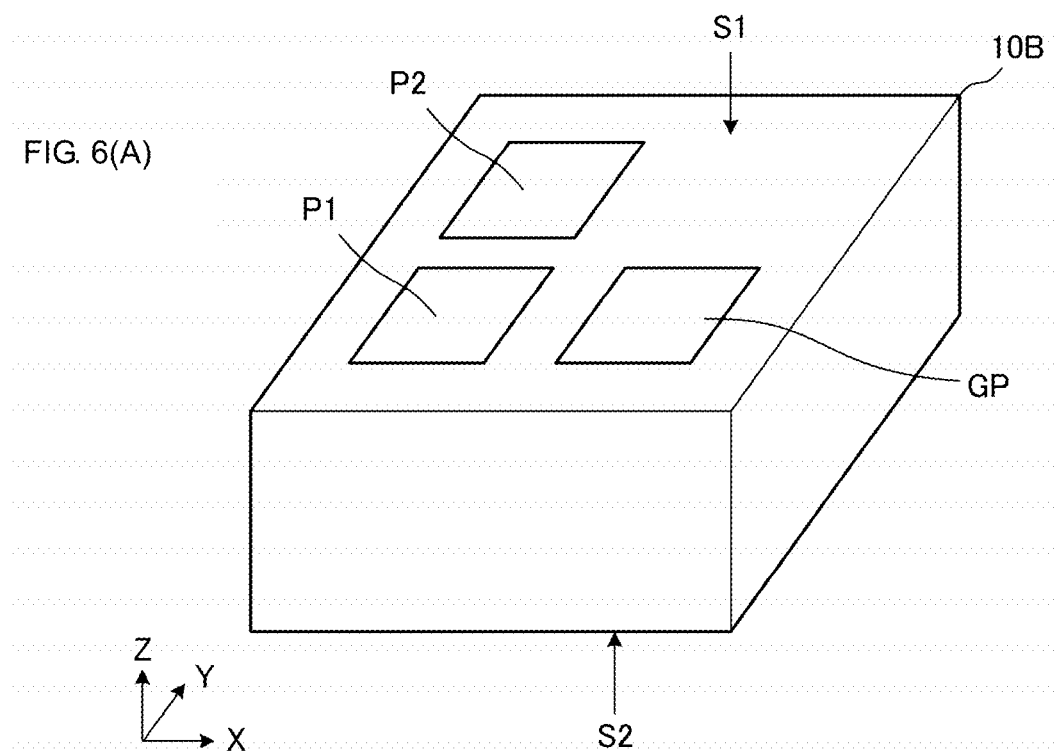
FIG. 6(A) is a perspective view of a thin-film ESD protection device 102 according to a second exemplary embodiment.
Figure 6B:
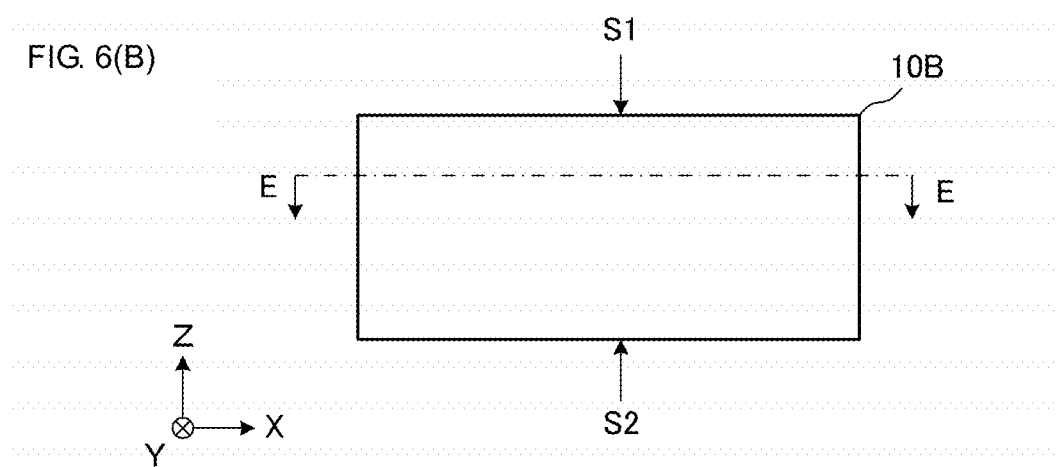
FIG. 6(B) is a front view of the thin-film ESD protection device 102.
Figure 7A:
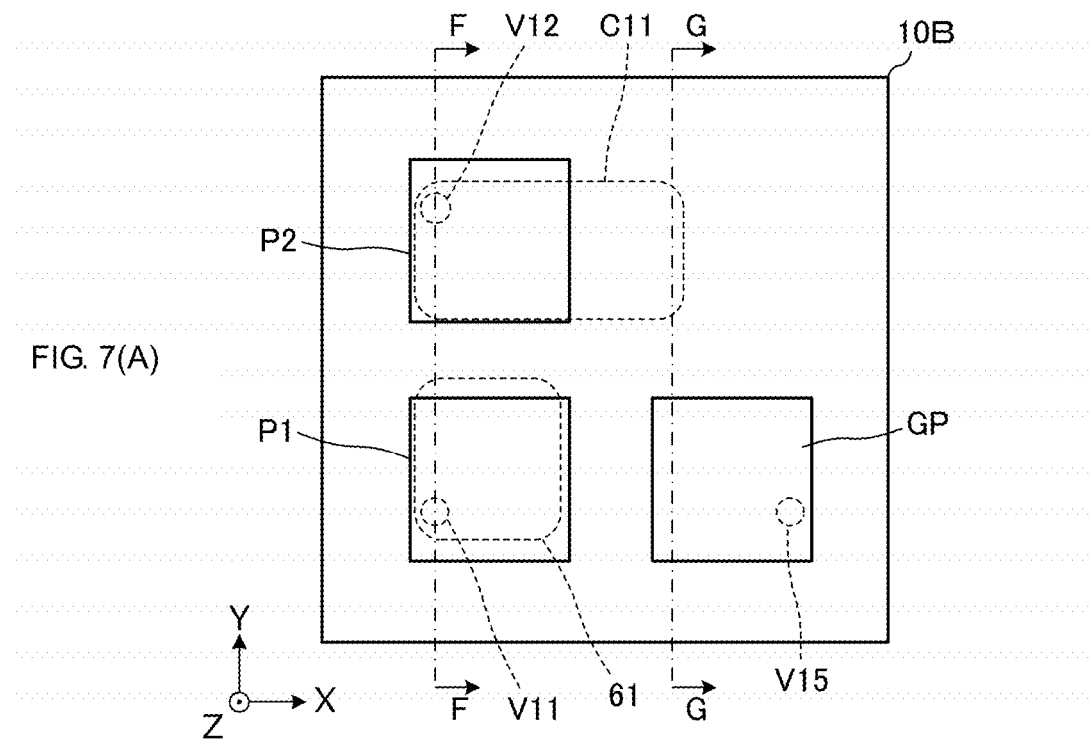
FIG. 7(A) is a bottom view of the thin-film ESD protection device 102.
Figure 7B:
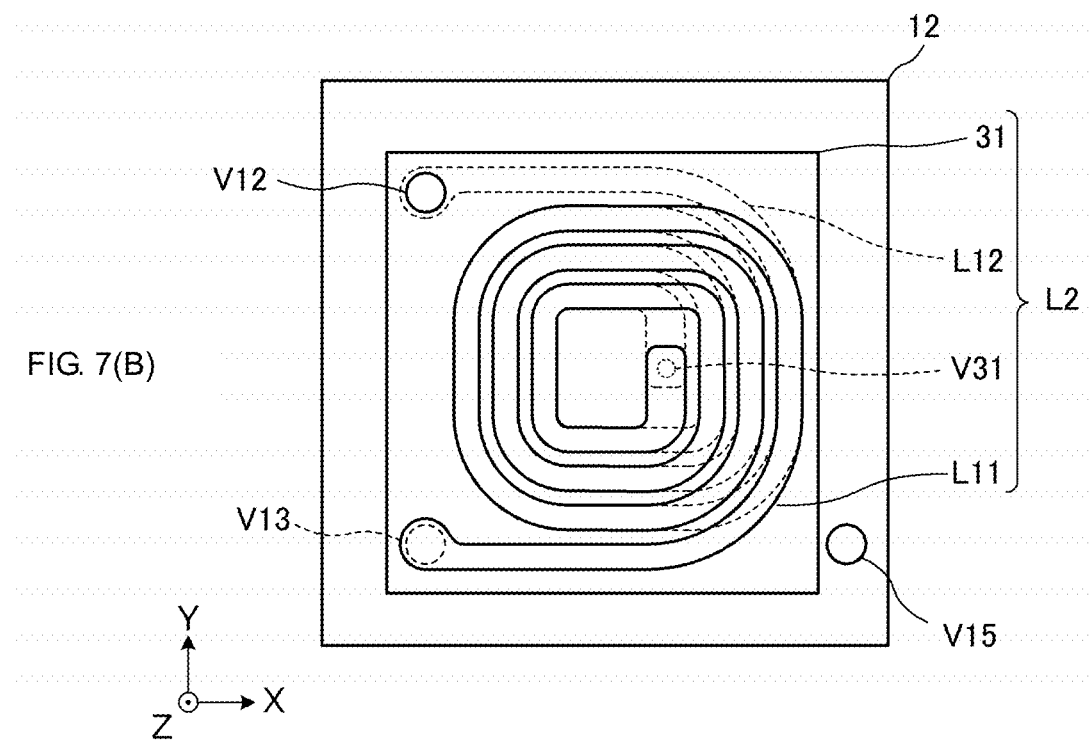
FIG. 7(B) is a cross-sectional view taken along line E-E in FIG. 6(B).
Figure 8A:
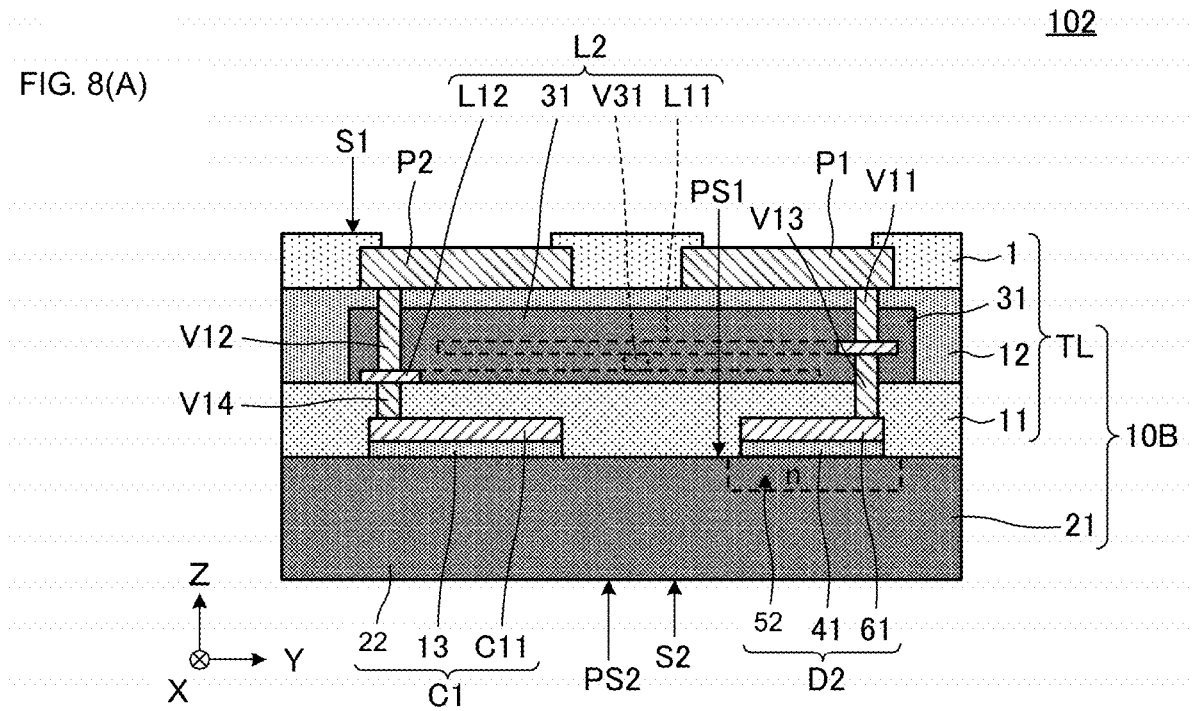
FIG. 8(A) is a cross-sectional view taken along line F-F in FIG. 7(A)
Figure 8B:
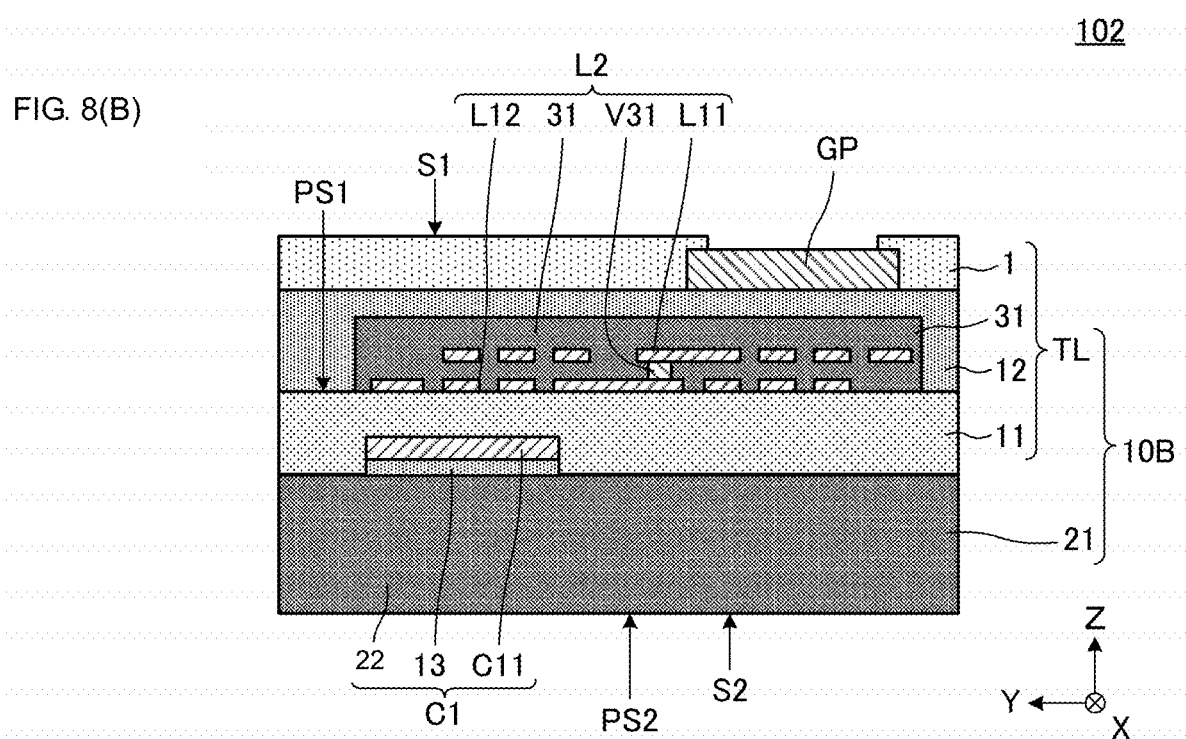
FIG. 8(B) is a cross-sectional view taken along line G-G in FIG. 7(A).

FIG. 6(A) is a perspective view of a thin-film ESD protection device 102 according to the second embodiment, and FIG. 6(B) is a front view of the thin-film ESD protection device 102. FIG. 7(A) is a bottom view of the thin-film ESD protection device 102, and FIG. 7(B) is a cross-sectional view taken along line E-E in FIG. 6(B). FIG. 8(A) is a cross-sectional view taken along line F-F in FIG. 7(A), and FIG. 8(B) is a cross-sectional view taken along line G-G in FIG. 7(A).

The thin-film ESD protection device 102 differs from the thin-film ESD protection device 101 of the first embodiment in the configuration of the semiconductor substrate and the configuration of the diode element. The thin-film ESD protection device 102 also differs from the thin-film ESD protection device 101 in the configuration. The other configurations are substantially the same as those of the thin-film ESD protection device 101.

Hereinafter, the differences from the thin-film ESD protection device 101 of the first embodiment will be described.

A semiconductor substrate 22 of the present embodiment has the n-type semiconductor layer 52 formed therein adjacent to the first principal surface PS1. The other configurations are substantially the same as those of the semiconductor substrate 21 described in the first embodiment. In the present embodiment, the entire semiconductor substrate 22, except the n-type semiconductor layer 51, corresponds to a "low-resistivity portion" in the present disclosure.

A diode element D2 of the present embodiment is formed adjacent to the first principal surface PS1 of the semiconductor substrate 22 and includes an n-type semiconductor layer 52, the p-type semiconductor layer 41, and the diode electrode 61. Specifically, for example, as illustrated in FIG. 8(A), the n-type semiconductor layer 52 (n-type well) with a predetermined depth is formed adjacent to the first principal surface PS1 of the semiconductor substrate 22. The n-type semiconductor layer 52 is partly exposed on the first principal surface PS1 of the semiconductor substrate 22, and the p-type semiconductor layer 41 is disposed on the surface of the n-type semiconductor layer 52 (i.e., on the first principal surface PS1). The p-type semiconductor layer 41 is formed, for example, by chemical vapor deposition (CVD). The diode electrode 61 is formed on the surface of the p-type semiconductor layer 41.

The insulating layer TL of the present embodiment is partly formed by a magnetic body 31. Specifically, the magnetic body 31 is formed inside the second insulating layer 12. The magnetic body 31 is formed, for example, by applying a resin coating produced by dispersing magnetic powder, such as ferrite powder, into resin, such as epoxy resin.

An inductor element L2 of the present embodiment includes the magnetic body 31, the coil conductors L11 and L12 formed in the magnetic body 31, and the interlayer connection conductor V31 formed in the magnetic body 31.

As illustrated in FIGS. 8(A) and 8(B), the magnetic body 31 is interposed between the low-resistivity portion (i.e., the entire semiconductor substrate 22 except the n-type semiconductor layer 52) and the coil conductors L11 and L12.

Aside from the effects described in the first embodiment, the thin-film ESD protection device 102 of the present embodiment has the following advantageous technical effects.

The thin-film ESD protection device 102 includes the magnetic body 31 as part of the insulating layer TL. With this configuration, because of the high magnetic permeability of the magnetic body 31, an inductor element having a predetermined inductance value can be obtained even with fewer turns.

In the thin-film ESD protection device 102, the magnetic body 31 is interposed between the low-resistivity portion (i.e., the entire semiconductor substrate 22 except the n-type semiconductor layer 52) and the coil conductors L11 and L12. In this configuration, where the magnetic body is interposed between the low-resistivity portion and the coil conductors L11 and L12, the magnetic shielding effect of the magnetic body further enhances isolation between the inductor element L2 and the low-resistivity portion. Therefore, this configuration makes it more difficult for eddy current to flow through the low-resistivity portion. The inductor element L2 with a higher Q factor can thus be obtained.

In the thin-film ESD protection device 12, the coil conductors L11 and L12 and the interlayer connection conductor V31 included in the inductor element L2 are formed in the magnetic body 31. In this configuration, a magnetic field from the inductor element L2 can be prevented, by the magnetic shielding effect of the magnetic body, from radiating out of the magnetic body 31. This configuration thus makes it more difficult for eddy current to flow through another conductor (e.g., the first capacitor electrode C11 forming the capacitor element C1) and further increases the Q factor of the inductor element L2.

Although the present embodiment shows an example in which the insulating layer TL is partly formed by the magnetic body 31, the configuration is not limited to this. The entire insulating layer TL may be formed by a magnetic body.

Although the present embodiment shows an example in which the magnetic body 31 is formed by applying a resin coating produced by dispersing magnetic powder, such as ferrite powder, into epoxy resin or the like, the configuration is not limited to this. The magnetic body 31 may be, for example, a sintered magnetic ferrite sheet.

Although the present embodiment shows an example in which the coil conductors L11 and L12 and the interlayer connection conductor V31 are formed inside the magnetic body 31, the configuration is not limited to this. The coil conductors L11 and L12 and the interlayer connection conductor V31 may be partly formed on the surface of the magnetic body. The coil conductors L11 and L12 and the interlayer connection conductor V31 have advantageous effects, such as those described in (a), as long as they are formed in the insulating layer TL. This means that the coil conductors L11 and L12 and the interlayer connection conductor V31 do not necessarily need to be formed in the magnetic body 31.

The thin-film ESD protection device 102 according to the present embodiment is manufactured, for example, by the following steps.

First, the semiconductor substrate 21 having the first principal surface PS1 and the second principal surface PS2 opposite each other is prepared. The semiconductor substrate 22 is, for example, a low-resistivity Si substrate.

Next, the diode element D2 is formed adjacent to the first principal surface PS1 of the semiconductor substrate 22. Specifically, first, an insulating film (not shown) with a predetermined cavity is formed adjacent to the first principal surface PS1 of the semiconductor substrate 22, and the cavity is doped with n-type impurities to form the n-type semiconductor layer 52 (n-type well). Next, the p-type semiconductor layer 41 is formed by patterning using chemical vapor deposition (CVD) on the surface of the n-type semiconductor layer 52 (i.e., on the first principal surface PS1). Then, the diode electrode 61 is formed on the surface of the p-type semiconductor layer 41.

Thus, the diode element D2 including the n-type semiconductor layer 52, the p-type semiconductor layer 41, and the diode electrode 61 is formed adjacent to the first principal surface PS1 of the semiconductor substrate 22.

Additionally, the capacitor element C1 is formed on the first principal surface PS1 of the semiconductor substrate 21 (in a region outside the n-type semiconductor layer 52). Specifically, first, the second capacitor electrode is formed. Next, the dielectric layer 13 is formed on the surface of the second capacitor electrode. Then, the first capacitor electrode C11 is formed on the surface of the dielectric layer 13.

The capacitor element C1 including the first capacitor electrode C11, the second capacitor electrode, and the dielectric layer 13 is thus formed on the first principal surface PS1 of the semiconductor substrate 22.

Next, the first insulating layer 11 is formed on the first principal surface PS1 of the semiconductor substrate 22. Specifically, the insulating layer 11 is formed by chemical vapor deposition (CVD) at least to a level which allows the p-type semiconductor layer 41, the diode electrode 61, the first capacitor electrode C11, and the dielectric layer 13 to be buried.

Next, the interlayer connection conductor V14 is formed in the first insulating layer 11. Specifically, after a hole is formed in the first insulating layer 11 by etching or the like, the interlayer connection conductor V14 is formed by ion sputtering or the like.

Next, the inductor element L2 is formed in the magnetic body 31. Specifically, after the coil conductor L12 is formed on the surface of the first insulating layer 11, a magnetic resin coating is applied or printed onto the coil conductor L12. The magnetic resin coating is a resin coating produced by dispersing magnetic powder, such as ferrite powder, into resin, such as epoxy resin. Then, after holes are formed in the magnetic resin coating by etching or the like, the interlayer connection conductors V13 and V31 are formed by ion sputtering or the like. After the coil conductor L11 is formed on the cured surface of the magnetic resin, an additional magnetic resin coating is applied or printed onto the coil conductor L11.

The inductor element L2 (including the magnetic body 31 and the coil conductors L11 and L12 and interlayer connection conductor V31 formed in the magnetic body 31) is formed as described above.

Next, the second insulating layer 12 is formed. Specifically, a resin coating is applied to the surface of the first insulating layer 11 and the surface of the magnetic body 31.

Next, the interlayer connection conductors V11, V12, and V15 are formed. Specifically, after holes are formed in the second insulating layer 12 and the magnetic body 31 by etching or the like, the interlayer connection conductors V11 and V12 are formed by ion sputtering or the like. Also, after a hole is formed in the first insulating layer 11, the second insulating layer 12, and the magnetic body 31, the interlayer connection conductor V15 is formed by ion sputtering or the like.

Next, the first input/output electrode P1, the second input/output electrode P2, and the ground electrode GP are formed on the surface of the second insulating layer 12. The first input/output electrode P1, the second input/output electrode P2, and the ground electrode GP are, for example, conductors formed by Ni/Au plating a conductor pattern of Cu on the surface of the second insulating layer 12.

Next, the protective layer 1 is formed on the surface of the second insulating layer 12. The protective layer 1 has cavities formed at positions corresponding to the first input/output electrode P1, the second input/output electrode P2, and the ground electrode GP. Therefore, even when the protective layer 1 is formed on the surface of the second insulating layer 12, the first input/output electrode P1, the second input/output electrode P2, and the ground electrode GP are exposed on the surface of the protective layer 1.

Last, the wafer is cut with a dicing machine into individual thin-film ESD protection devices 102.

Third Embodiment

A third embodiment shows an exemplary thin-film ESD protection device that includes a ground electrode different from that of the embodiments described above.

Figure 9A:
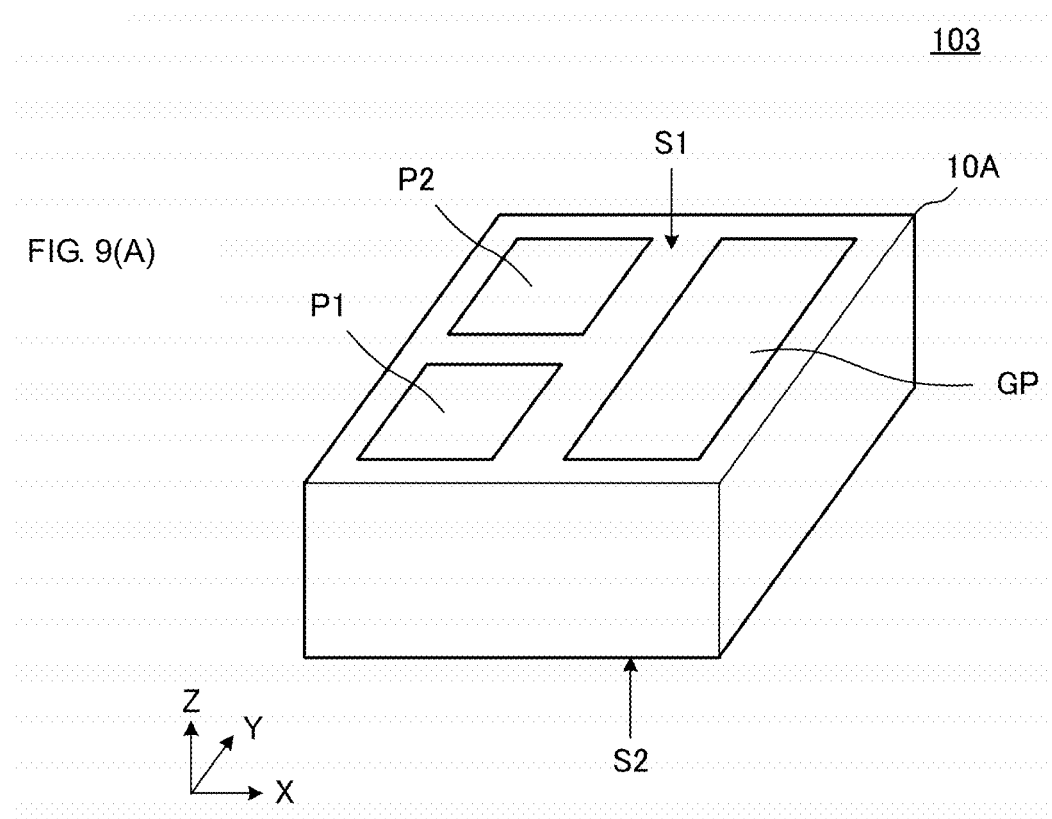
FIG. 9(A) is a perspective view of a thin-film ESD protection device 103 according to a third exemplary embodiment.
Figure 9B:
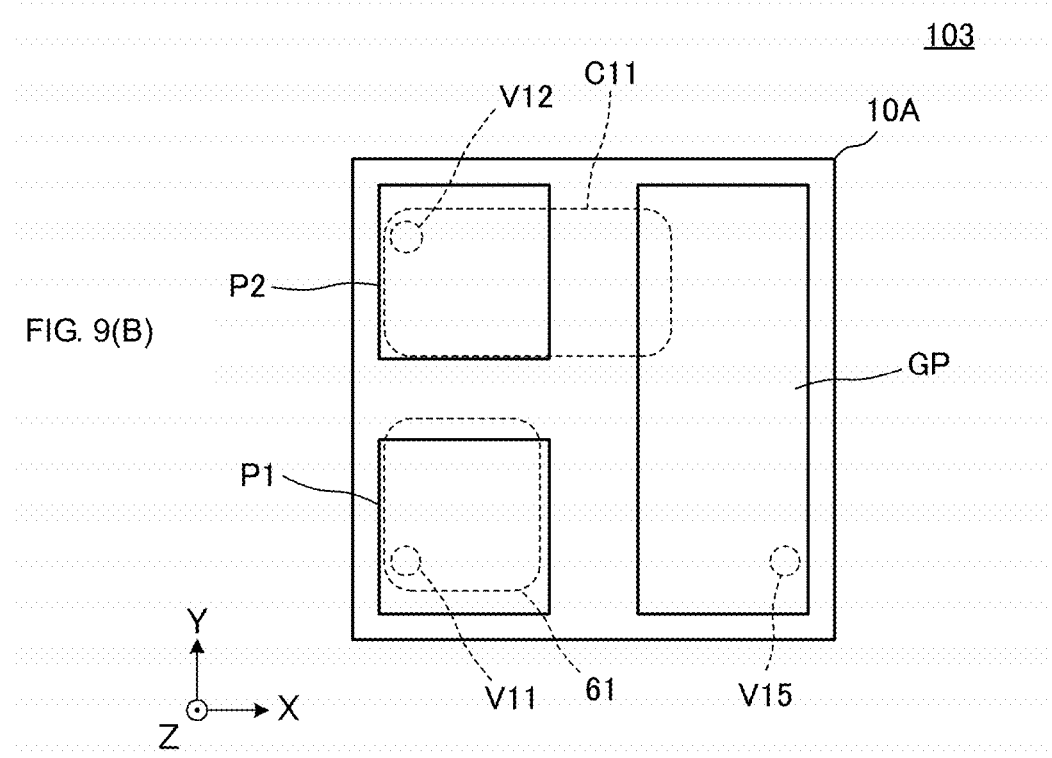
FIG. 9(B) is a bottom view of the thin-film ESD protection device 103.

FIG. 9(A) is a perspective view of a thin-film ESD protection device 103 according to the third embodiment, and FIG. 9(B) is a bottom view of the thin-film ESD protection device 103.

The thin-film ESD protection device 103 differs from the thin-film ESD protection device 101 of the first embodiment in the shape of the ground electrode GP. The other configurations are the same as those of the thin-film ESD protection device 101.

Hereinafter, the difference from the thin-film ESD protection device 101 of the first embodiment will be described.

The ground electrode GP according to the present embodiment is a rectangular conductor whose longitudinal direction coincides with the Y-axis direction.

With this configuration, advantageous effects similar to those of the first embodiment are achieved.

Fourth Embodiment

A fourth embodiment shows an exemplary thin-film ESD protection device that includes a plurality of ground electrodes.

Figure 10A:
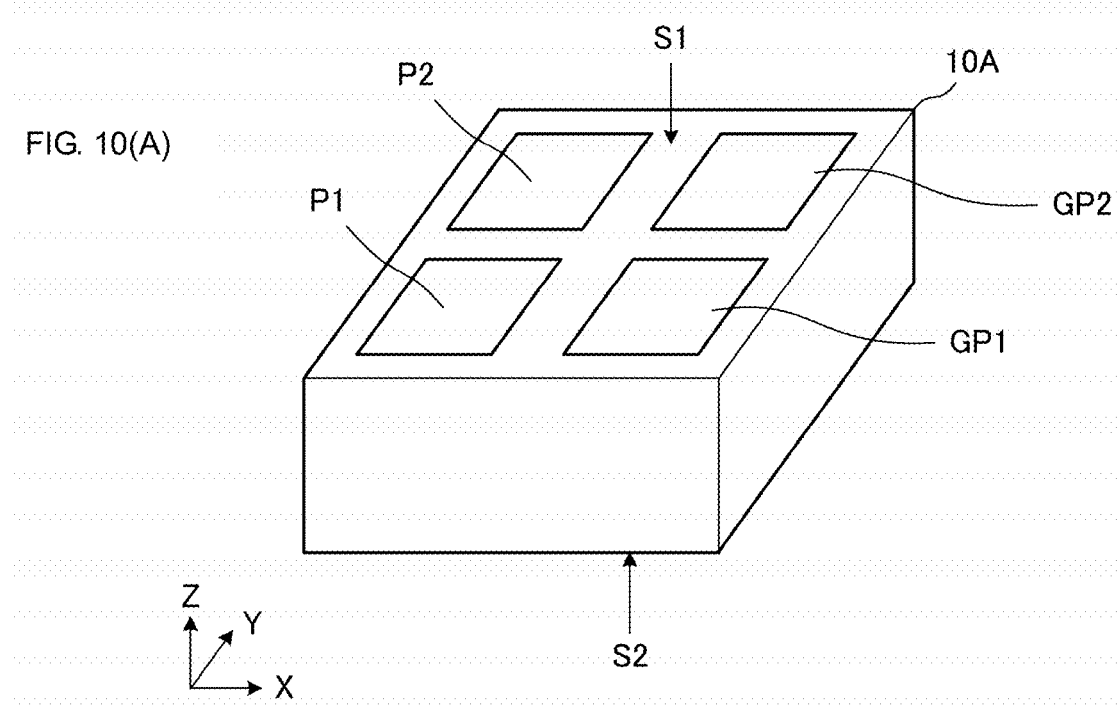
FIG. 10(A) is a perspective view of a thin-film ESD protection device 104 according to a fourth exemplary embodiment.
Figure 10B:
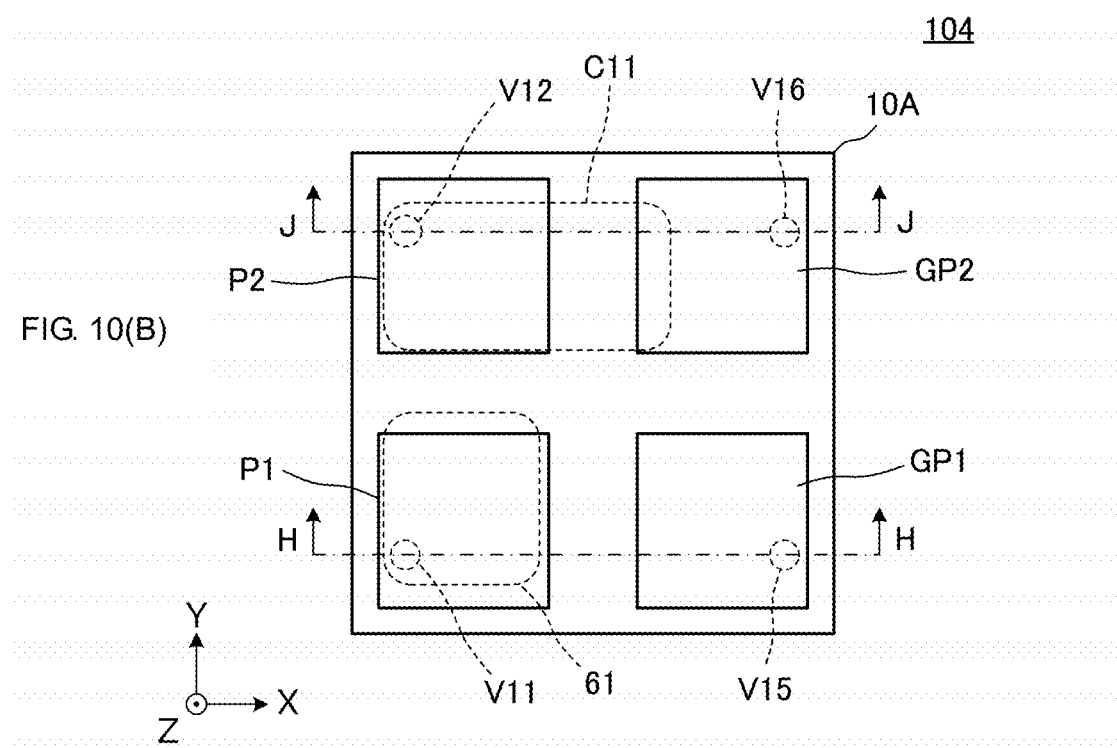
FIG. 10(B) is a bottom view of the thin-film ESD protection device 104.
Figure 11A:
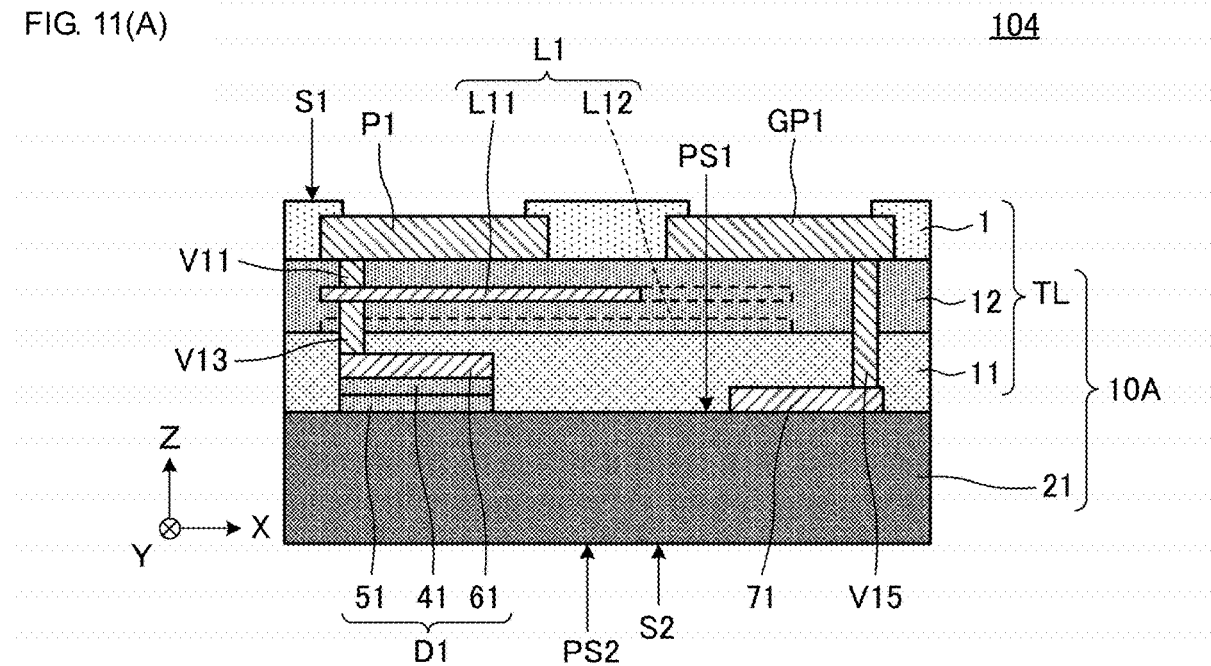
FIG. 11(A) is a cross-sectional view taken along line H-H in FIG. 10(B)
Figure 11B:
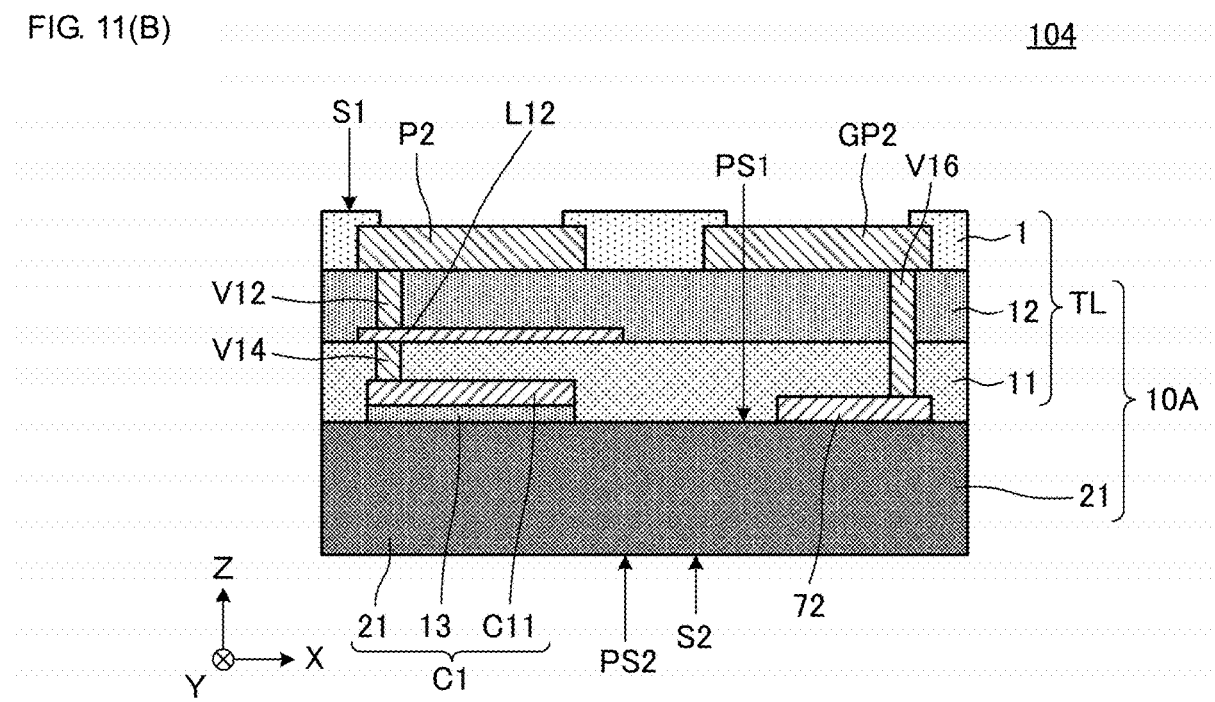
FIG. 11(B) is a cross-sectional view taken along line J-J in FIG. 10(B).
Figure 12:
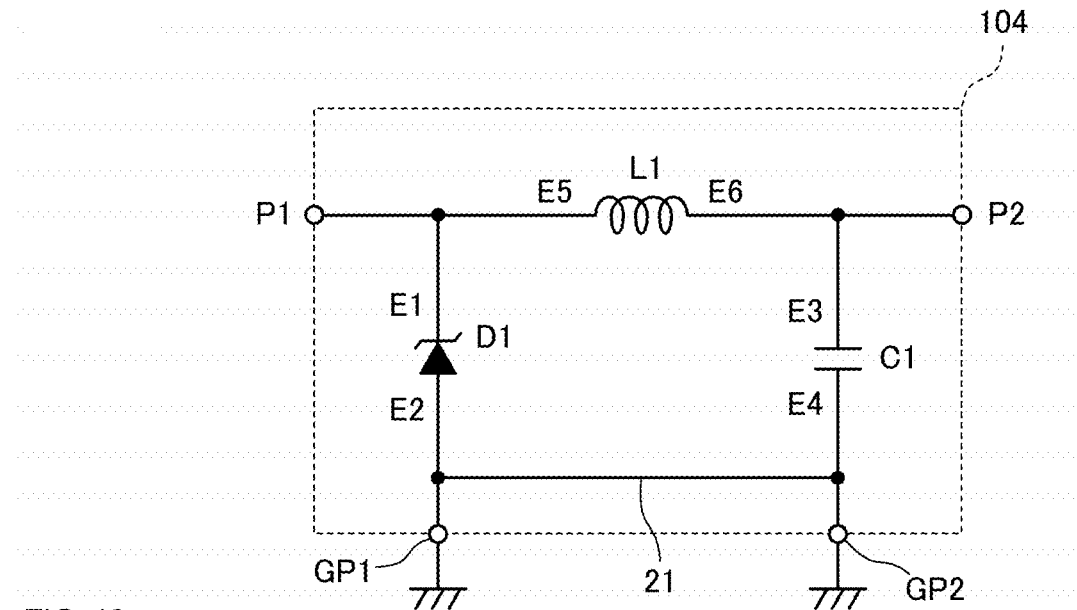
FIG. 12 is a circuit diagram of the thin-film ESD protection device 104.

FIG. 10(A) is a perspective view of a thin-film ESD protection device 104 according to the fourth embodiment, and FIG. 10(B) is a bottom view of the thin-film ESD protection device 104. FIG. 11(A) is a cross-sectional view taken along line H-H in FIG. 10(B), and FIG. 11(B) is a cross-sectional view taken along line J-J in FIG. 10(B). FIG. 12 is a circuit diagram of the thin-film ESD protection device 104.

The thin-film ESD protection device 104 differs from the thin-film ESD protection device 101 of the first embodiment in that it includes two ground electrodes GP1 and GP2. The other configurations are substantially the same as those of the thin-film ESD protection device 101.

Hereinafter, the difference from the thin-film ESD protection device 101 of the first embodiment will be described.

The ground electrodes GP1 and GP2 are terminals arranged in a land grid array (LGA) for mounting on a mount board or the like, and are formed like rectangular islands on a surface of the insulating layer TL (or on the first surface S1 of the multilayer body 10A). The ground electrodes GP1 and GP2 are arranged along the Y-axis direction.

As illustrated in FIG. 11(A), the ground electrode GP1 is connected by the conductor 71 and the interlayer connection conductor V15 to the semiconductor substrate 21 (low-resistivity portion). As illustrated in FIG. 11(B), the ground electrode GP2 is connected by a conductor 72 and the interlayer connection conductor V16 to the semiconductor substrate 21 (low-resistivity portion).

In the present embodiment, the first input/output electrode P1 and the second input/output electrode P2 are disposed near the first side (or the left-hand side of the multilayer body 10A in FIG. 10(B)), and the ground electrodes GP1 and GP2 are disposed near the second side (or the right-hand side of the multilayer body 10A in FIG. 10(B)).

With this configuration, advantageous effects similar to those of the first embodiment are achieved.

Fifth Embodiment

A fifth embodiment shows an example in which the arrangement of the first input/output electrode, the second input/output electrode, and the ground electrode differs from that in the embodiments described above.

Figure 13:
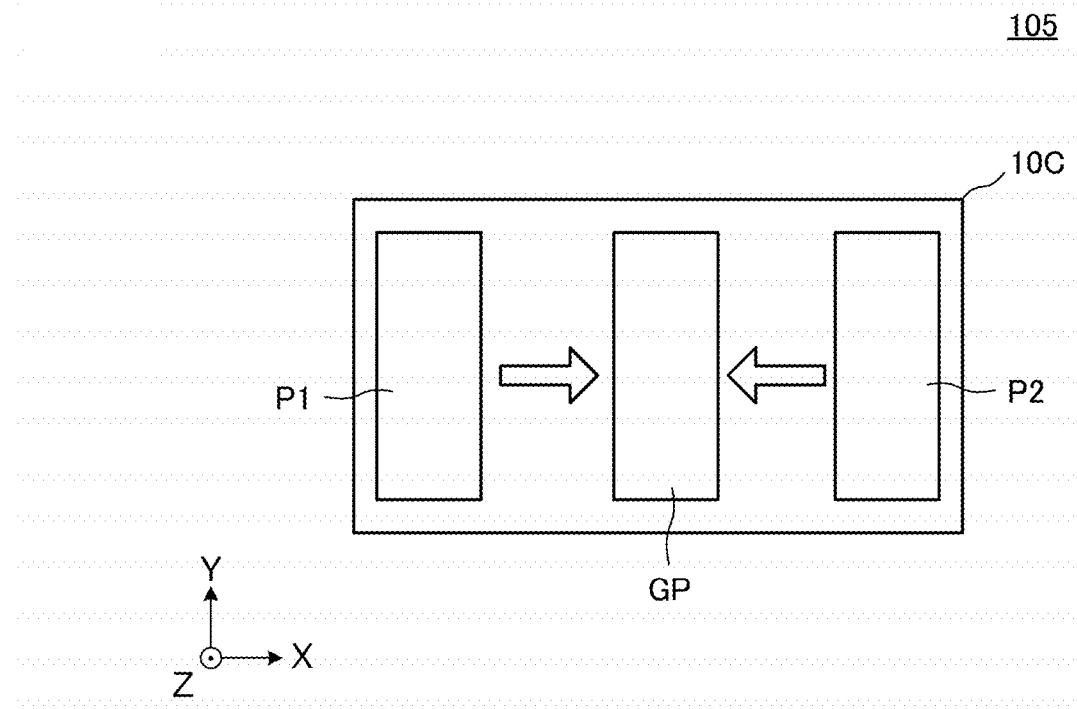
FIG. 13 is a bottom view of a thin-film ESD protection device 105 according to a fifth exemplary embodiment.
Figure 14:
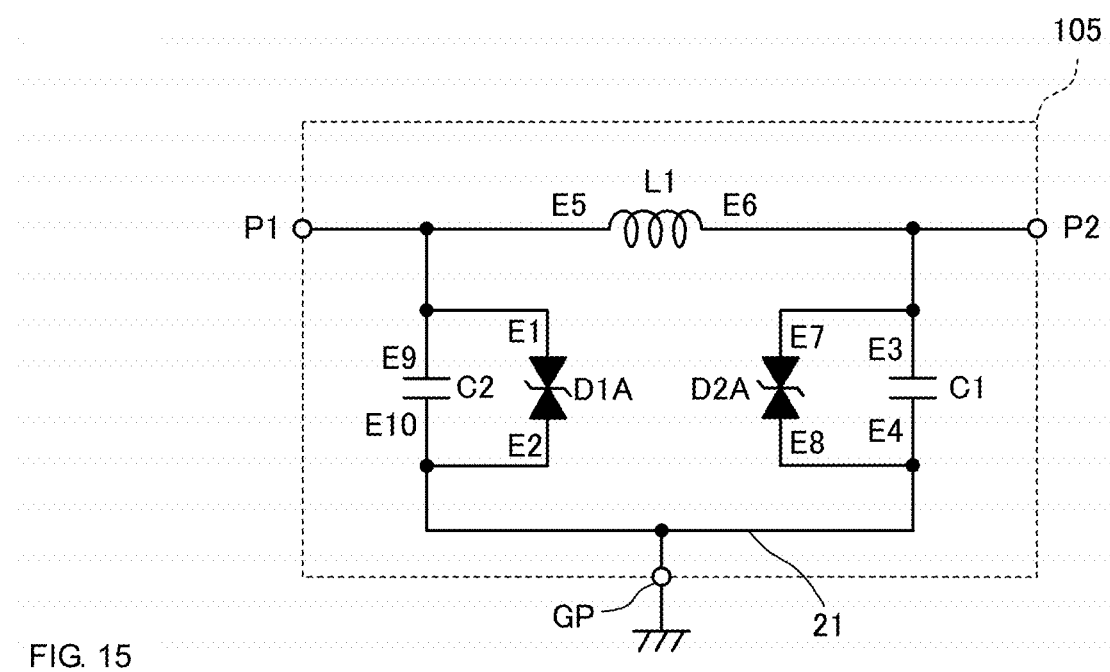
FIG. 14 is a circuit diagram of the thin-film ESD protection device 105.

FIG. 13 is a bottom view of a thin-film ESD protection device 105 according to the fifth embodiment. FIG. 14 is a circuit diagram of the thin-film ESD protection device 105.

As described above, the thin-film ESD protection device 105 differs from the thin-film ESD protection device 103 of the third embodiment in the arrangement of the first input/output electrode P1, the second input/output electrode P2, and the ground electrode GP. The thin-film ESD protection device 105 includes a diode element D1A that differs in structure from the diode element D1 of the third embodiment. The thin-film ESD protection device 105 also differs from the thin-film ESD protection device 103 in that it further includes a diode element D2A and a capacitor element C2. The other configurations of the thin-film ESD protection device 105 are substantially the same as those of the thin-film ESD protection device 103.

Hereinafter, the differences from the thin-film ESD protection device 103 of the third embodiment will be described.

As illustrated in FIG. 14, the diode elements D1A and D2A are each formed by two p-n junction diodes whose cathodes are connected. The diode elements D1A and D2A both have Zener characteristics. The capacitor element C2 has substantially the same configuration as the capacitor element C1.

The diode element D1A and the capacitor element C2 are connected in parallel between the first input/output electrode P1 and the ground electrode GP. Specifically, the first end E1 of the diode element D1A and a ninth end E9 of the capacitor element C2 are electrically connected to the first input/output electrode P1, and the second end E2 of the diode element D1A and a tenth end E10 of the capacitor element C2 are electrically connected to the ground electrode GP. At the same time, the diode element D2A and the capacitor element C1 are connected in parallel between the second input/output electrode P2 and the ground electrode GP. Specifically, a seventh end E7 of the diode element D2A and the third end E3 of the capacitor element C1 are electrically connected to the second input/output electrode P2, and an eighth end E8 of the diode element D2A and the fourth end E4 of the capacitor element C1 are electrically connected to the ground electrode GP.

Thus, in the thin-film ESD protection device 105, the diode elements D1A and D2A, the inductor element L1, and the capacitor elements C1 and C2 form a π-type low-pass filter having an ESD protection function.

In the present embodiment, as illustrated in FIG. 13, in plan view of the first principal surface of the semiconductor substrate (i.e., as viewed from the Z-axis direction), the ground electrode GP is interposed between the first input/output electrode P1 and the second input/output electrode P2 in the X-axis direction.

Figure 15:
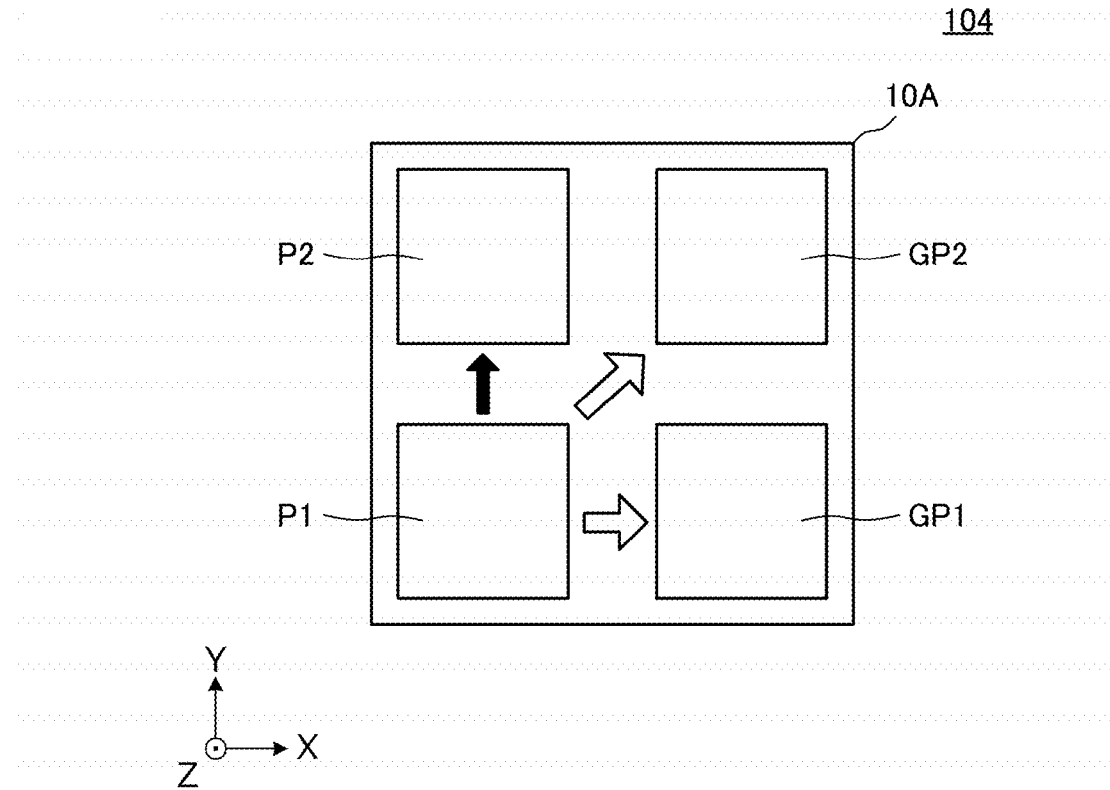
FIG. 15 is a bottom view of the thin-film ESD protection device 104 according to the fourth exemplary embodiment.

The effect of positioning the ground electrode GP between the first input/output electrode P1 and the second input/output electrode P2 will now be described with reference to drawings. FIG. 15 is a bottom view of the thin-film ESD protection device 104 according to the fourth embodiment, which is a comparative example.

As illustrated in FIG. 15, when the first input/output electrode P1 and the second input/output electrode P2 are adjacent to each other and ESD applied to one of the input/output electrodes is transferred to the ground (ground electrodes GP1 and GP2) (see, open arrows in FIG. 15), the ESD may flow to the other input/output electrode mainly through the low-resistivity portion (see, e.g., a filled arrow in FIG. 15). On the other hand, in the present embodiment, where the ground electrode GP is interposed between the first input/output electrode P1 and the second input/output electrode P2, when ESD applied to one of the input/output electrodes is transferred to the ground (ground electrode GP) (see, open arrows in FIG. 13), the ESD can be prevented from flowing to the other input/output electrode mainly through the low-resistivity portion.

That is, by positioning the ground electrode GP between the first input/output electrode P1 and the second input/output electrode P2, the isolation between the first input/output electrode P1 and the second input/output electrode P2 against ESD can be improved.

Sixth Embodiment

A sixth embodiment shows an example in which the arrangement of the first input/output electrode, the second input/output electrode, and the ground electrode differs from the embodiments described above.

Figure 16:
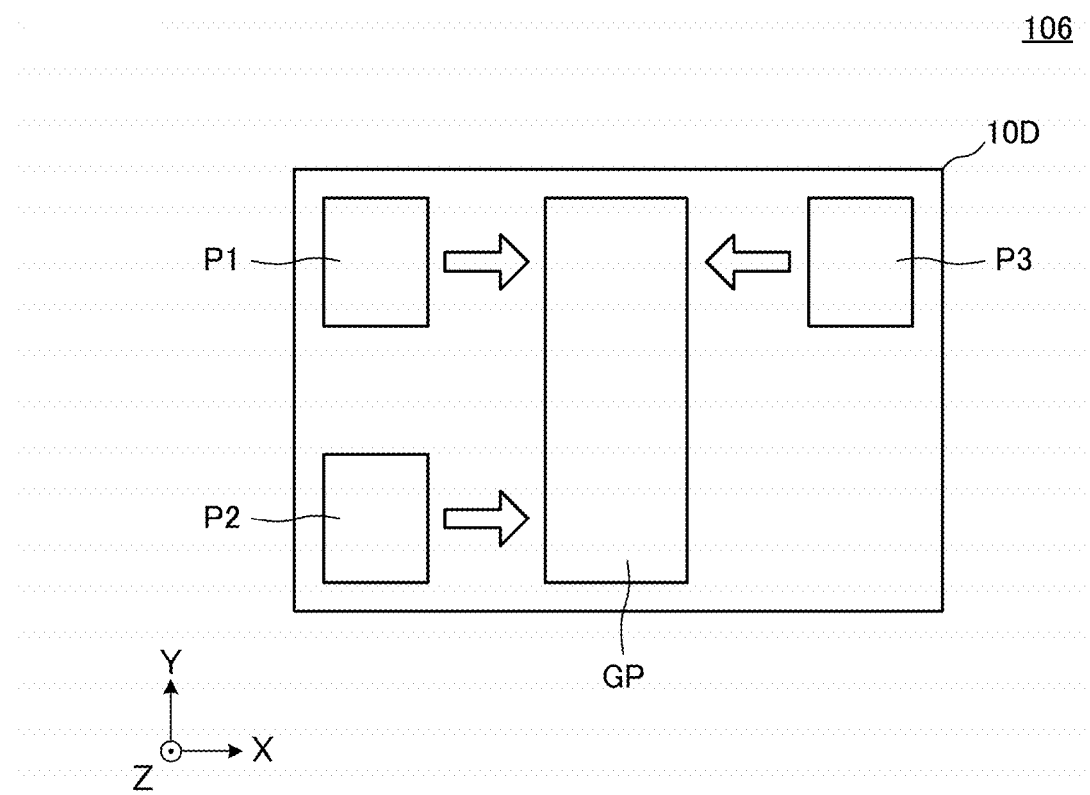
FIG. 16 is a bottom view of a thin-film ESD protection device 106 according to a sixth exemplary embodiment.

FIG. 16 is a bottom view of a thin-film ESD protection device 106 according to the sixth embodiment.

The thin-film ESD protection device 106 differs from the thin-film ESD protection device 105 of the fifth embodiment in that it further includes a third input/output electrode P3. The thin-film ESD protection device 106 also differs from the thin-film ESD protection device 105 in the size of the first input/output electrode P1 and the second input/output electrode P2. The other configurations of the thin-film ESD protection device 106 are substantially the same as those of the thin-film ESD protection device 105.

Hereinafter, the differences from the thin-film ESD protection device 105 of the fifth embodiment will be described.

In the present embodiment, the first input/output electrode P1 and the second input/output electrode P2 are disposed near the first side (or the left-hand side of a multilayer body 10D in FIG. 16), and the third input/output electrode P3 is disposed near the second side (or the right-hand side of the multilayer body 10D in FIG. 16). The first input/output electrode P1 and the second input/output electrode P2 are arranged along the Y-axis direction. The ground electrode GP is disposed near the center of the multilayer body 10D.

In the present embodiment, as illustrated in FIG. 16, in plan view of the first principal surface of the semiconductor substrate (i.e., as viewed from the Z-axis direction), the distance between the first input/output electrode P1 and the ground electrode GP, the distance between the second input/output electrode P2 and the ground electrode GP, and the distance between the third input/output electrode P3 and the ground electrode GP are substantially equal.

A diode element is connected (not shown) between the first input/output electrode P1 and the ground electrode GP. Another diode element is connected (not shown) between the second input/output electrode P2 and the ground electrode GP. Another diode element is connected (not shown) between the third input/output electrode P3 and the ground electrode GP.

Figure 17A:
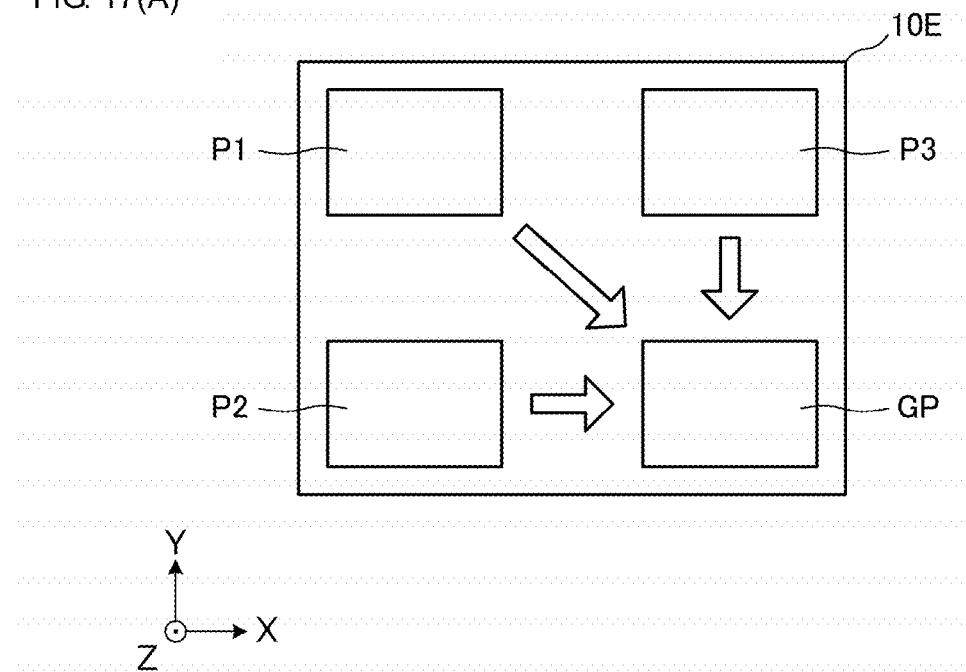
FIG. 17(A) is a plan view of a thin-film ESD protection device 106A.
Figure 17B:
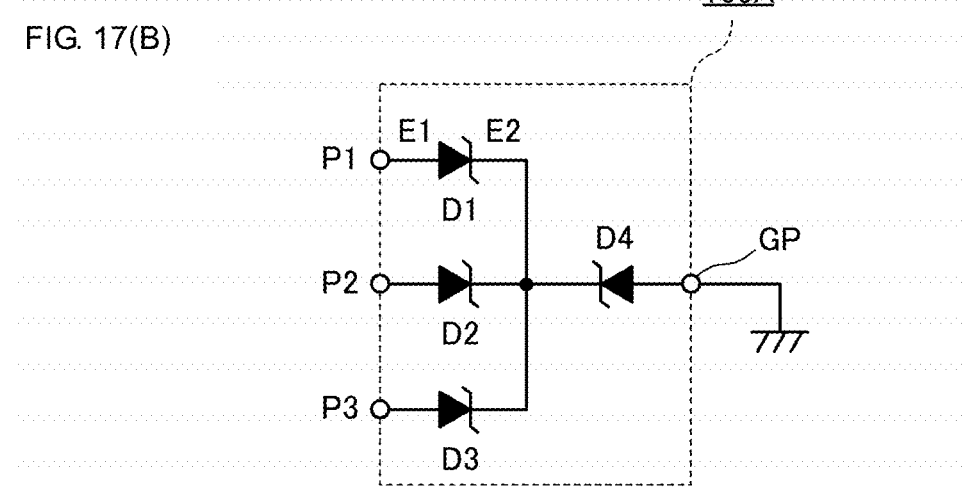
FIG. 17(B) is a circuit diagram of the thin-film ESD protection device 106A.
Figure 18:
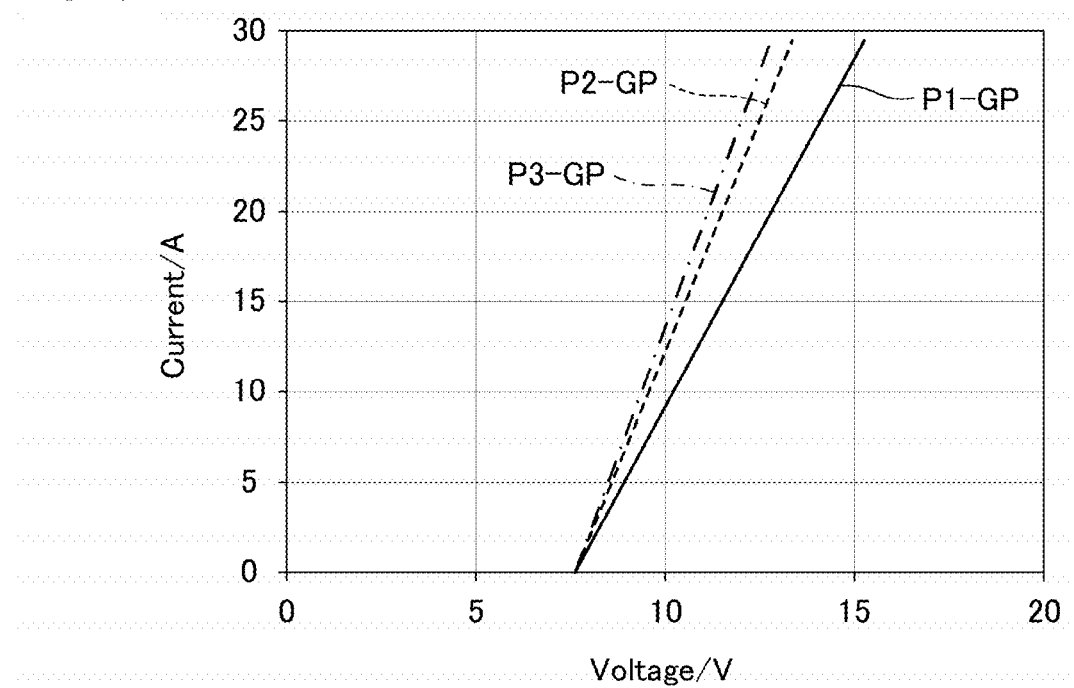
FIG. 18 is a graph showing a V-I characteristic between each input/output electrode and a ground electrode of the thin-film ESD protection device 106A.

The effect achieved by the fact that the input/output electrodes (first input/output electrode P1, second input/output electrode P2, and third input/output electrode P3) are substantially equidistant to the ground electrode GP will now be described with reference to drawings. FIG. 17(A) is a plan view of a thin-film ESD protection device 106A, which is a comparative example, and FIG. 17(B) is a circuit diagram of the thin-film ESD protection device 106A. FIG. 18 is a graph showing a V-I characteristic between each input/output electrode and the ground electrode of the thin-film ESD protection device 106A.

As illustrated in FIG. 17(A), the distance between the first input/output electrode P1 and the ground electrode GP is longer than the distance between either of the other input/output electrodes (second input/output electrode P2 and third input/output electrode P3) and the ground electrode GP. Generally, when the distance between the input/output electrode and the ground electrode is long, the value of dynamic resistance between the input/output electrode and the ground electrode is high. If the distance between each input/output electrode and the ground electrode GP varies, ESD suppression voltage between each input/output electrode and the ground electrode varies, as shown in FIG. 18.

In the present embodiment, however, the input/output electrodes are substantially equidistant to the ground electrode. This reduces variation in the value of dynamic resistance between each input/output electrode and the ground electrode, and thus can eventually reduce variation in ESD suppression voltage between each input/output electrode and the ground electrode.

Other Embodiments

Although the embodiments described above show an example in which the multilayer body is a rectangular-parallelepiped-shaped body which is rectangular in plan view, the configuration is not limited to this. It should be appreciated that the shape of the multilayer body may be appropriately changed to an extent which does not impair the advantageous effects of the exemplary embodiments of the present invention. The multilayer body may be, for example, polygonal, circular, oval, L-shaped, crank-shaped, T-shaped, or Y-shaped in plan view. Like the multilayer body, the semiconductor substrate may also be appropriately changed in shape to an extent which does not impair the advantageous effects of the present invention.

Although the embodiments described above show the semiconductor substrate 21 or 22 having the first principal surface PS1 and the second principal surface PS2 opposite each other, the configuration of the semiconductor substrate is not limited to this. The second principal surface PS2 of the semiconductor substrate does not necessarily need to be opposite the first principal surface PS1 and may be a curved surface. The semiconductor substrate does not necessarily need to have the second principal surface PS2, as long as it has the first principal surface PS1.

Although the exemplary embodiments of the present disclosure as described above show a configuration in which the first surface S1 of the multilayer body (or the surface of the second insulating layer 12) has the protective layer 1 formed thereon, the configuration is not limited to this, and the protective layer 1 is optional. The second surface S2 of the multilayer body (or the second principal surface PS2 of the semiconductor substrate) may have a protective layer formed thereon.

Although the exemplary embodiments described above show an example in which the entire, or substantially the entire, semiconductor substrate is a low-resistivity portion, the configuration is not limited to this. The low-resistivity portion may have any configuration that connects the second end of the diode element to the fourth end of the capacitor element. The low-resistivity portion may be a portion that is formed at least adjacent to the first principal surface PS1 of the semiconductor substrate.

Although the first to fourth exemplary embodiments show an example in which the low-resistivity portion (semiconductor substrate) serves as the cathode electrode and the second capacitor electrode, the configuration of the low-resistivity portion is not limited to this. The low-resistivity portion may be, for example, the anode electrode of the diode element. The anode or cathode electrode and the second capacitor electrode may be formed on the surface of the low-resistivity portion included in the semiconductor substrate.

Although the first to fourth exemplary embodiments show the diode elements D1 and D2 that are p-n junction diodes, the diode elements are not limited to this configuration. As described in the fifth and sixth embodiments, the diode elements may each be formed by two p-n junction diodes connected in series, with the cathodes thereof connected together. Alternatively, the diode elements may each be formed by two p-n junction diodes connected in series, with the anodes thereof connected together.

The exemplary embodiments described above show an exemplary inductor element having a winding axis extending in the Z-axis direction. However, the configuration is not limited to this. It is noted that the shape and the number of winding turns of the inductor element may be appropriately changed to an extent which does not impair the advantageous effects of the present invention. The inductor element may have, for example, a planar spiral shape, a planar loop shape, a helical shape, or a meandering shape. The winding axis of the inductor element may also be appropriately changed to an extent which does not impair the advantageous effects of the present invention. For example, the winding axis of the inductor element may extend along the X-axis direction or Y-axis direction.

Although the exemplary embodiments described above show an exemplary thin-film ESD protection device where a low-pass filter is formed, the configuration is not limited to this. It should be appreciated that a circuit formed in the thin-film ESD protection device may be appropriately changed to an extent which does not impair the advantageous effects of the present invention.

Although the exemplary embodiments described above show an example in which the first input/output electrode P1, the second input/output electrode P2, and the ground electrode GP are rectangular conductors, the configuration is not limited to this. The first input/output electrode P1, the second input/output electrode P2, and the ground electrode GP may be appropriately changed in shape. The arrangement and the number of the first input/output electrode P1, the second input/output electrode P2, and the ground electrode GP may also be appropriately changed, in accordance with the circuit configuration of the thin-film ESD protection device.

Finally, it is noted that the description of the exemplary embodiments is illustrative and not restrictive in all aspects. Modifications and changes may be appropriately made by those skilled in the art. The scope of the present invention is defined by the appended claims, not by the embodiments described above. Changes made to the embodiments within the appended claims and scopes equivalent thereto are also embraced by the present invention.

REFERENCE SIGNS LIST

D1, D1A, D2, D2A, D3, D4: diode element
C1, C2: capacitor element
C11: first capacitor electrode
L1, L2: inductor element
L11, L12: coil conductor
E1: first end of diode element
E2: second end of diode element
E3: third end of capacitor element
E4: fourth end of capacitor element
E5: fifth end of inductor element
E6: sixth end of inductor element
E7: seventh end of diode element
E8: eighth end of diode element
E9: ninth end of capacitor element
E10: tenth end of capacitor element
P1: first input/output electrode
P2: second input/output electrode
P3: third input/output electrode
GP, GP1, GP2: ground electrode
PS1: first principal surface of semiconductor substrate
PS2: second principal surface of semiconductor substrate
S1: first surface of multilayer body
S2: second surface of multilayer body
TL: insulating layer
V11, V12, V13, V14, V15, V16, V31: interlayer connection conductor
1: protective layer
10A, 10B, 10C, 10D, 10E: multilayer body
11: first insulating layer
12: second insulating layer
13: dielectric layer
21, 22: semiconductor substrate
31: magnetic body
41: p-type semiconductor layer
51, 52: n-type semiconductor layer
61: diode electrode
71: conductor
101, 102, 103, 104, 105, 106, 106A: thin-film ESD protection device

The invention claimed is:

1. A thin-film ESD protection device comprising:
a semiconductor substrate including a low-resistivity portion adjacent to at least a first principal surface thereof;
an insulating layer disposed on the first principal surface of the semiconductor substrate;
a first input/output electrode, a second input/output electrode, and a ground electrode disposed on a surface of the insulating layer opposite the semiconductor substrate;
a diode element disposed adjacent to the first principal surface and having a first end electrically connected to the first input/output electrode and a second end electrically connected to the ground electrode; and
a capacitor element disposed adjacent to the first principal surface of the semiconductor substrate and having a first end electrically connected to the second input/output electrode and a second end electrically connected to the ground electrode,
wherein the respective second ends of the diode element and the capacitor element are electrically connected by the low-resistivity portion to the ground electrode, and
wherein the ground electrode is interposed between the first input/output electrode and the second input/output electrode in a plan view of the first principal surface of the semiconductor substrate.

2. The thin-film ESD protection device according to claim 1, wherein the diode element and the capacitor element are disposed in a planar configuration with respect to each other on the first principal surface of the semiconductor substrate.

3. The thin-film ESD protection device according to claim 1, wherein an entirety of the semiconductor substrate comprises the low-resistivity portion.

4. The thin-film ESD protection device according to claim 3, wherein the low-resistivity semiconductor substrate comprises a silicon (Si) substrate.

5. The thin-film ESD protection device according to claim 1,
wherein the diode element includes an anode electrode and a cathode electrode;
wherein the capacitor element includes a first capacitor electrode and a second capacitor electrode; and
wherein the low-resistivity portion is configured as one of the cathode electrode or the anode electrode of the diode element and as the second capacitor electrode.

6. The thin-film ESD protection device according to claim 1,
wherein the diode element includes an anode electrode and a cathode electrode;
wherein the capacitor element includes a first capacitor electrode and a second capacitor electrode; and
wherein one of the anode electrode or cathode electrode of the diode element comprises a same material as the first capacitor electrode or the second capacitor electrode.

7. The thin-film ESD protection device according to claim 1,
wherein the diode element includes an anode electrode and a cathode electrode;
wherein the capacitor element includes a first capacitor electrode, a second capacitor electrode, and a dielectric layer; and
wherein the insulating layer comprises a same material as the dielectric layer.

8. The thin-film ESD protection device according to claim 1, wherein the semiconductor substrate and the insulating layer form a multilayer body having a rectangular shape with a first side and a second side opposite each other in the plan view of the first principal surface of the semiconductor substrate.

9. The thin-film ESD protection device according to claim 8, wherein the first input/output electrode and the second input/output electrode are disposed adjacent to the first side of the multilayer body and the ground electrode is disposed adjacent to the second side of the multilayer body.

10. The thin-film ESD protection device according to claim 1, wherein, in the plan view of the first principal surface of the semiconductor substrate, a distance between the first input/output electrode and the ground electrode is equal to a distance between the second input/output electrode and the ground electrode.

11. A thin-film ESD protection device comprising:
a semiconductor substrate including a low-resistivity portion adjacent to at least a first principal surface thereof;
an insulating layer disposed on the first principal surface of the semiconductor substrate;
a first input/output electrode, a second input/output electrode, and a ground electrode disposed on a surface of the insulating layer opposite the semiconductor substrate;
a diode element disposed adjacent to the first principal surface and having a first end electrically connected to the first input/output electrode and a second end electrically connected to the ground electrode;
a capacitor element disposed adjacent to the first principal surface of the semiconductor substrate and having a first end electrically connected to the second input/output electrode and a second end electrically connected to the ground electrode; and
an inductor element disposed in the insulating layer and having a first end electrically connected to the first input/output electrode and a second end electrically connected to the second input/output electrode,
wherein the respective second ends of the diode element and the capacitor element are electrically connected by the low-resistivity portion to the ground electrode.

12. The thin-film ESD protection device according to claim 11, wherein the insulating layer is at least partly formed by a magnetic body, and the inductor element includes the magnetic body and a coil conductor formed in the insulating layer.

13. The thin-film ESD protection device according to claim 12, wherein the magnetic body is at least partly interposed between the coil conductor and the low-resistivity portion.

14. The thin-film ESD protection device according to claim 11, wherein the capacitor element and the inductor element are configured as a low-pass filter.

15. A thin-film ESD protection device comprising:
a semiconductor substrate including a ground connection portion disposed in a first principal surface thereof;
an insulating layer disposed on the first principal surface of the semiconductor substrate;
a first input/output electrode, a second input/output electrode, and a ground electrode disposed on a surface of the insulating layer opposite the semiconductor substrate;
a diode element disposed above the semiconductor substrate and having a first end electrically connected to the first input/output electrode and a second end electrically connected to the ground electrode; and
a capacitor element disposed above the semiconductor substrate and having a first end electrically connected to the second input/output electrode and a second end electrically connected to the ground electrode,
wherein the respective second ends of the diode element and the capacitor element are electrically connected by the ground connection portion to the ground electrode, and
wherein the ground electrode is interposed between the first input/output electrode and the second input/output electrode in a plan view of the first principal surface of the semiconductor substrate.

16. The thin-film ESD protection device according to claim 15, wherein the diode element and the capacitor element are disposed in a planar configuration on the first principal surface of the semiconductor substrate.

17. The thin-film ESD protection device according to claim 15, wherein an entirety of the semiconductor substrate comprises silicon (Si).

18. The thin-film ESD protection device according to claim 15,
wherein the semiconductor substrate and the insulating layer form a multilayer body having a rectangular shape with a first side and a second side opposite each other in the plan view of the first principal surface of the semiconductor substrate, and
wherein the first input/output electrode and the second input/output electrode are disposed adjacent to the first side of the multilayer body and the ground electrode is disposed adjacent to the second side of the multilayer body.

* * * * *